US012811105B2

(12) United States Patent
Huang et al.

(10) Patent No.: US 12,811,105 B2
(45) Date of Patent: Nov. 24, 2026

(54) PARALLEL PLASMA TREATMENT AND THERMOCOMPRESSION BONDING AND APPARATUS FOR EFFECTING THE SAME

(71) Applicant: Taiwan Semiconductor Manufacturing Company Limited, Hsinchu (TW)

(72) Inventors: Hui-Min Huang, Taoyuan City (TW); Kai Jun Zhan, Taoyuan City (TW); Chih-Yuan Chiu, Zhudong Township (TW); Ming-Da Cheng, Taoyuan (TW); Amram Eitan, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 636 days.

(21) Appl. No.: 18/327,921

(22) Filed: Jun. 2, 2023

(65) Prior Publication Data

US 2024/0404989 A1 Dec. 5, 2024

(51) Int. Cl.
*H01J 37/32* (2006.01)
*H10W 72/00* (2026.01)
*H10W 72/20* (2026.01)

(52) U.S. Cl.
CPC .... *H01J 37/3244* (2013.01); *H01J 37/32816* (2013.01); *H01J 2237/335* (2013.01);
(Continued)

(58) Field of Classification Search
CPC ............. H01J 37/3244; H01J 37/32816; H01J 2237/335; H01J 37/32449;
(Continued)

(56) References Cited

U.S. PATENT DOCUMENTS

2003/0164394 A1 9/2003 Suga et al.
2006/0054283 A1* 3/2006 Yamauchi ............... H01L 24/81 156/582
(Continued)

FOREIGN PATENT DOCUMENTS

CN 1340851 A 3/2002
CN 101447400 A 6/2009
(Continued)

OTHER PUBLICATIONS

TW Patent and Trademark Office; TW Application No. 112128551; Office Action mailed Jun. 19, 2024; 14 pages.
(Continued)

*Primary Examiner* — Laura M Dykes
(74) *Attorney, Agent, or Firm* — The Marbury Law Group, PLLC

(57) ABSTRACT

A bonded assembly may be formed by providing a wafer comprising at least a first packaging substrate and a second packaging substrate in a low-oxygen ambient; performing a first plasma package-treatment process on the first semiconductor package in the low-oxygen ambient while performing a first substrate-treatment process on the first packaging substrate in a low-oxygen ambient having an oxygen partial pressure that is lower than 17 kPa; and performing a second plasma package-treatment process on the second semiconductor package while performing a second substrate-treatment process on the second packaging substrate and while bonding the first semiconductor package to the first packaging substrate.

20 Claims, 17 Drawing Sheets

(52) U.S. Cl.
CPC .. *H10W 72/01271* (2026.01); *H10W 72/0198* (2026.01); *H10W 72/0711* (2026.01); *H10W 72/07118* (2026.01); *H10W 72/07141* (2026.01); *H10W 72/07173* (2026.01); *H10W 72/072* (2026.01); *H10W 72/07211* (2026.01); *H10W 72/07232* (2026.01); *H10W 72/07236* (2026.01); *H10W 72/241* (2026.01)

(58) Field of Classification Search
CPC ....... H01J 37/32477; H01L 2224/7501; H01L 2224/75252; H01L 2224/75301; H01L 2224/7565; H01L 2224/7598; H01L 2224/81013; H01L 2224/81022; H01L 2224/81191; H01L 2224/81203; H01L 2224/81234; H01L 2224/81815; H01L 2224/97; H01L 2924/20102; H01L 2924/20103; H01L 24/13; H01L 24/16; H01L 2224/75101; H01L 2224/81054
USPC .......................................................... 438/106
See application file for complete search history.

(56) References Cited

U.S. PATENT DOCUMENTS

| | | | |
|---|---|---|---|
| 2016/0276204 A1 | 9/2016 | Sakata et al. | |
| 2020/0075517 A1* | 3/2020 | Kim ........................ | H01L 24/02 |
| 2021/0265303 A1 | 8/2021 | Bajwa et al. | |
| 2024/0339430 A1* | 10/2024 | Ma .................... | H01L 21/67092 |

FOREIGN PATENT DOCUMENTS

| | | | | |
|---|---|---|---|---|
| CN | 110391146 | A | | 10/2019 |
| CN | 111696876 | A | | 9/2020 |
| JP | S63293952 | A | * | 11/1988 |
| JP | 2004154898 | A | * | 6/2004 |
| KR | 20120126870 | A | | 11/2012 |
| KR | 20210102460 | A | | 8/2021 |
| TW | 1699858 | B | | 7/2020 |
| WO | 2020146466 | A1 | | 7/2020 |

OTHER PUBLICATIONS

KR Patent and Trademark Office; KR Application No. 10-2023-0164215; Office Action mailedApr. 1, 2025; 16 pages.

German Patent and Trademark Office; DE Application No. 10 2023 130 200.0; first Office Action mailed Nov. 21, 2025; 12 pages.

CN Patent and Trademark Office; CN Application No. 202410334924.9; Office Action mailed Sep. 12, 2025; 14 pages.

* cited by examiner

PARALLEL PLASMA TREATMENT AND THERMOCOMPRESSION BONDING AND APPARATUS FOR EFFECTING THE SAME

BACKGROUND

Bonding a semiconductor die to a packaging substrate typically uses a plasma treatment process followed by a thermocompression bonding process, which may take a long time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
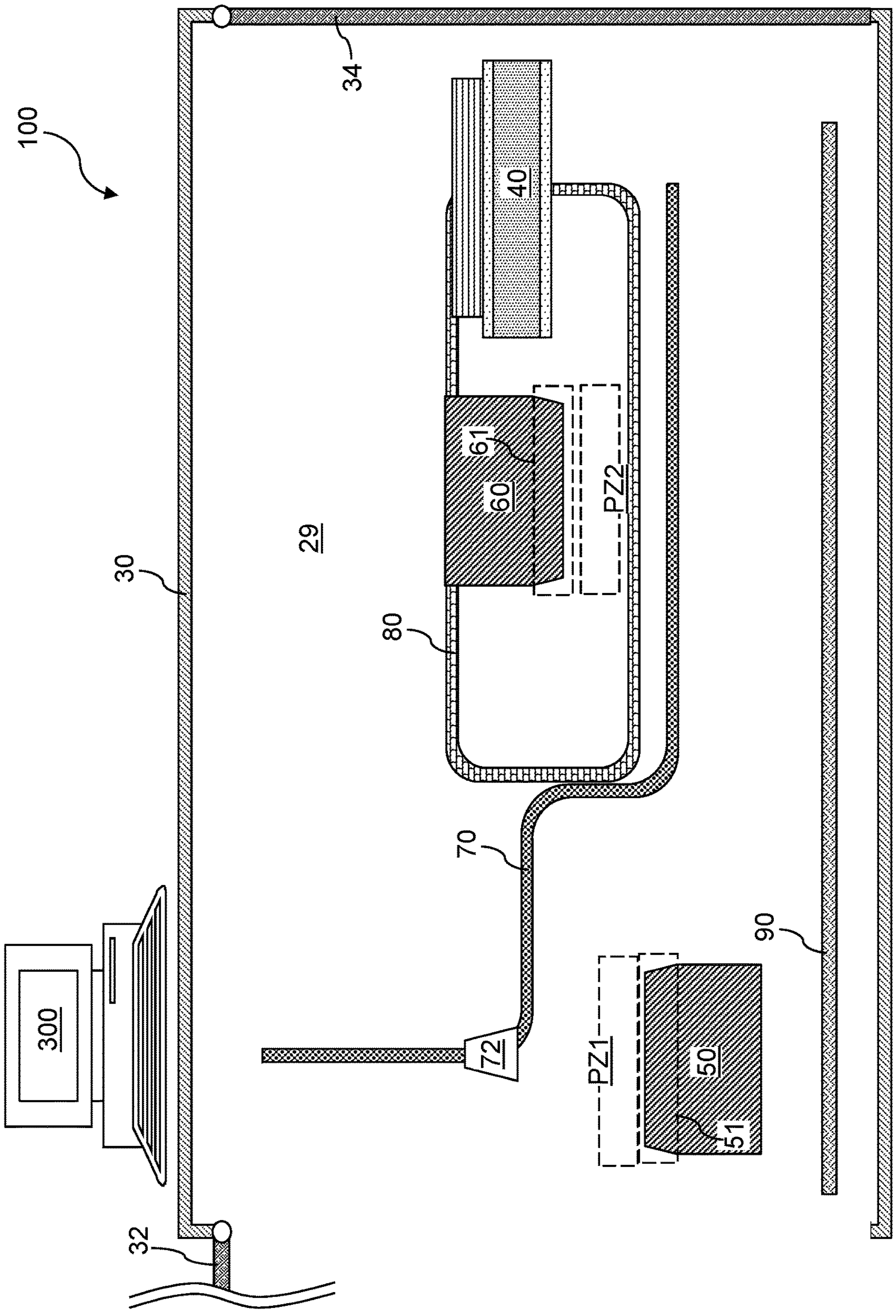
FIG. 1 is a vertical cross-sectional view of a first exemplary apparatus prior to loading a wafer and semiconductor packages according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Atmospheric pressure plasma jet (APPJ) treatment may be performed to clean surface contaminants from bonding structures and solder material portions prior to performing a thermocompression bonding (TCB) process between a semiconductor die and a packaging substrate. APPJ treatment is a type of plasma treatment that maybe used to modify the surface properties of materials. Plasma is a state of matter that is created when a gas is ionized, or when its atoms are stripped of some of their electrons, creating mixture of ions, electrons, and neutral particles. Plasma may be created at a variety of pressures, including atmospheric pressure.

There are several factors that may contribute to the time-consuming nature of APPJ treatment. One factor is the desire for precise control of the plasma parameters, such as temperature, plasma density, and gas flow rate. These parameters should be carefully controlled in order to achieve the desired surface modification without damaging the material being treated. Such control may consume a large amount of time and attention from an operator. In addition, the material surface may further benefit from a careful cleaning and preparation before the APPJ treatment. This may include removing contaminants, roughing up the surface to improve adhesion, or applying a pre-treatment to improve the effectiveness of the plasma treatment. Sequential performance of the APPJ treatment and the bonding process for each bonded pair of a semiconductor die and a packaging substrate may be time-consuming.

According to an aspect of the present disclosure, apparatus and methods are provided for parallel execution of APPJ treatment and TCB process over multiple pairs of a respective semiconductor die and a respective packaging substrate. A combination of a stationary plasma treatment system and a mobile plasma treatment system may be used to simultaneously provide plasma treatments on a pair of a semiconductor die and a packaging substrate, while a mobile thermocompressive bonding head performs a thermocompressive bonding process on another pair of a semiconductor die and a packaging substrate. The plasma treatment processes and the bonding process may be performed in a low-oxygen environment. Joint interfaces may be free of bonding line interfaces. Various embodiments disclosed herein may provide time efficient execution of APPJ treatments and TCB processes.

Referring to FIG. 1, a first exemplary apparatus 100 according to an embodiment of the present disclosure is illustrated. The first exemplary apparatus 100 comprises a process chamber (30, 32, 34) including chamber enclosure 30 and an ambient control system configured to provide a low-oxygen ambient 29 within a volume that is spatially bounded by the chamber enclosure 30. As used herein, a "low-oxygen ambient" refers to an ambient having an oxygen partial pressure that is lower than the oxygen partial pressure (of about 21.23 kPa) in a standard atmospheric condition. In one embodiment, the low-oxygen ambient 29 may have an oxygen partial pressure that is lower than about 80% of the oxygen partial pressure in standard atmospheric conditions, such as lower than 17 kPa. The total pressure of the low-oxygen ambient 29 may be in a range from 10 Pa to 120 kPa. The atmospheric pressure in the standard atmospheric condition is 101.33 kPa. In one embodiment, the partial pressure of oxygen in the low-oxygen ambient 29 may be in a range from $1.0\times10^{-6}$ Pa to 10.13 kPa. Generally, the low oxygen partial pressure in the low-oxygen ambient 29 may be provided by reducing the total pressure of the low-oxygen ambient 29 and/or by reducing the fraction of oxygen in the composition of the ambient gas in the low-oxygen ambient 29. In one embodiment, the molecular fraction of oxygen in the low-oxygen ambient 29 may be in a range from $1.0\times10^{-9}$ to 0.2095 (which is the fraction of oxygen atoms in the normal atmospheric composition). A suitable mechanism (not expressly shown) such as an ambient gas supply nozzle, an exhaust port, and/or a vacuum pumping port may be provided as needed to maintain the composition and the pressure of the low-oxygen ambient 29 at a pre-determined level.

The chamber enclosure 30 may comprise a first opening and second opening. A first door 32 may be provided at the first opening in a manner that provides sealing of a volume that is enclosed by the chamber enclosure 30. A second door 34 may be provided at the second opening in a manner that provides sealing of the volume that is enclosed by the chamber enclosure 30. Suitable door actuation mechanisms may be provided for the first door 32 and the second door 34 so that the first door 32 and the second door 34 may be opened and closed to provide transport of semiconductor packages and packaging substrates in and out of the chamber enclosure 30. While the present disclosure is described using an embodiment in which a first door 32 and a second door 34 are located on opposite sides of the low-oxygen ambient, embodiments are expressly contemplated herein in which the first door 32 and the second door 34 are arranged differently, or merged as a single door.

A first plasma treatment system 50 may be provided in the process chamber. The first plasma treatment system 50 comprises a first plasma nozzle 51 configured to generate a first plasma in a first plasma zone PZ1. A second plasma treatment system 60 may be provided in the process chamber. The second plasma treatment system 60 comprises a second plasma nozzle 61 configured to generate a second plasma P2 in a second plasma zone PZ2 (which is a portable plasma zone that can be moved with movement of the second plasma treatment system 60). Each of the first plasma treatment system 50 and the second plasma treatment system 60 can be configured to generate a respective atmospheric pressure plasma jet containing ions of a respective reducing gas, i.e., a respective gas that can combine oxygen atoms to de-oxidize a surface. A thermocompressive bonding head 40 may be provided in the process chamber. The thermocompressive bonding head 40 may be configured to bond a semiconductor package to a packaging substrate. In other words, the thermocompressive bonding head 40 may include all necessary components that are configured to provide thermocompressive bonding between a semiconductor package and a packaging substrate. Generally, a commercially available thermocompressive bonding head may be used.

The first exemplary apparatus 100 comprises various transport systems to move the second plasma treatment system 60, the thermocompressive bonding head 40, a plurality of semiconductor packages, and a plurality of packaging substrates (which may be provided within a wafer). For example, a first transport system (70, 72) may be configured to laterally move semiconductor packages to a selected package bonding position selected from a plurality of package bonding positions. A second transport system 80 may be configured to move the second plasma treatment system 60 to a selected plasma treatment position selected from a plurality of plasma treatment positions, and may be configured to move a thermocompressive bonding head 40 to a selected bonding position selected from a plurality of bonding positions. Further, a third transport system 90 may be configured to transport a wafer including a plurality of packaging substrates into a processing position. The plurality of package bonding positions may overlie a location of a respective packaging substrate upon loading a plurality of packaging substrates.

In a non-limiting illustrative example, the first transport system (70, 72) may comprise a first transport path 70 configured to move a package handler 72. The package handler 72 may be configured to grab and release a semiconductor package. The second plasma treatment system 60 may be attached to a first movable element (not expressly shown) on the second transport system 80. The thermocompressive bonding head 40 may be attached to a second movable element (not expressly shown) on the second transport system 80.

Generally, movement of any movable elements within the first exemplary apparatus 100 may be controlled by a process controller 300. Further, operation of all elements within the first exemplary apparatus 100 may be controlled by the process controller 300. For example, the process controller 300 may be configured to control operation of the first plasma treatment system 50, the second plasma treatment system 60, and the thermocompressive bonding head 40.

In one embodiment, the first plasma treatment system 50 is stationary, and the first transport system (70, 72) is configured to transport a selected semiconductor package to a position in proximity to the first plasma treatment system 50 prior to performing a plasma package-treatment process, and to transport the selected semiconductor package to a position facing a selected packaging substrate after performing the plasma package-treatment process.

The first exemplary apparatus 100 may be used to form a bonded assembly of a plurality of semiconductor packages and a plurality of packaging substrates. The semiconductor packages may consist of a single semiconductor die, or may comprise an interposer to which at least one semiconductor die (which may, or may not, comprise a plurality of semiconductor dies) is attached. The plurality of packaging substrates may be provided within a wafer. In one embodiment, a wafer including a two-dimensional array of packaging substrates may be used.

Figure 2:
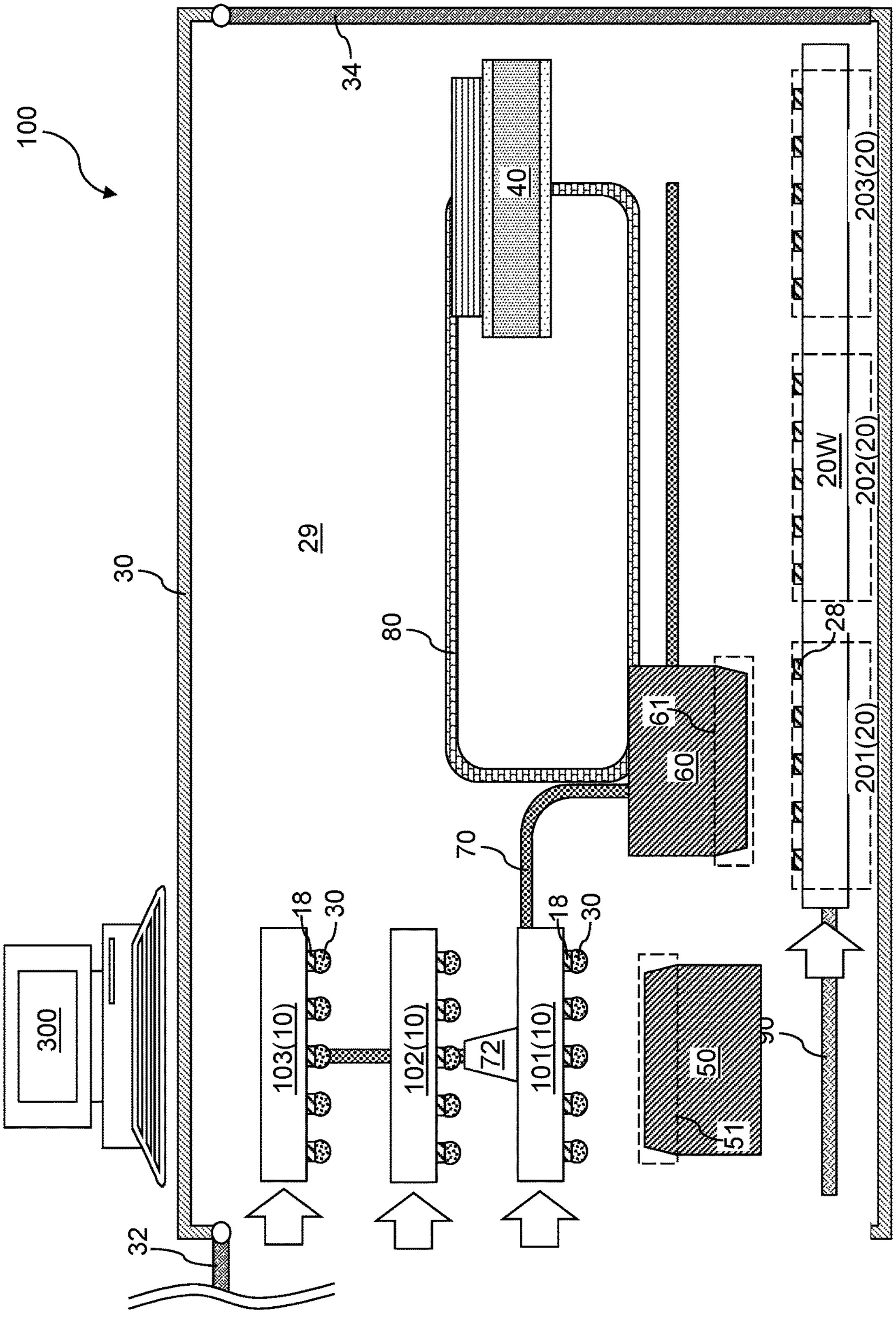
FIG. 2 is a vertical cross-sectional view of the first exemplary apparatus after loading a wafer and semiconductor packages according to an embodiment of the present disclosure.

Referring to FIG. 2, the first door 32 may be opened. In one embodiment, the ambient outside the low-oxygen ambient 29 may be controlled to be similar to the low oxygen ambient so that disturbance to the composition and the pressure of the low-oxygen ambient 29 may be minimized. A plurality of semiconductor packages 10 may be loaded into the chamber enclosure 30. In the illustrated example, the plurality of semiconductor packages 10 may comprise a first semiconductor package 101, a second semiconductor package 102, and a third semiconductor package 103. While the present invention is described using an embodiment in which three semiconductor packages 10 are loaded into the chamber enclosure 30, embodiments are expressly contemplated herein in which two or more than three semiconductor packages 10 are loaded into the chamber enclosure 30 at a time. The total number of semiconductor packages 10 loaded into the chamber enclosure 30 may be in a range from 2 to $10^{13}$, although a greater number may also be used.

As used herein, a semiconductor package refers to any of a conventional semiconductor die that functions as a stand-alone package, or a composite package including an interposer and at least one semiconductor die. In one embodiment, one, a plurality, and/or each, of the semiconductor packages 10 loaded into the chamber enclosure 30 may comprise a respective fan-out package including at least one semiconductor chip and an interposer. In one embodiment, the interposer may comprise an organic interposer.

A plurality of packaging substrates 20 may be loaded into the chamber enclosure 30. In the illustrated example, the plurality of packaging substrates 20 may comprise a first packaging substrate 201, a second packaging substrate 202, and a third packaging substrate 203. While the present invention is described using an embodiment in which three packaging substrates 20 are loaded into the chamber enclosure 30, embodiments are expressly contemplated herein in which two or more than three packaging substrates 20 are loaded into the chamber enclosure 30 at a time. The total number of packaging substrates 20 loaded into the chamber enclosure 30 may be in a range from 2 to $10^{13}$, although a greater number may also be used. In one embodiment, the number of the packaging substrates 20 that are loaded into the chamber enclosure 30 may be the same as the number of semiconductor packages 10 that are loaded into the chamber enclosure 30.

In one embodiment, the plurality of packaging substrates 20 may be provided as portions of a wafer 20W. In one embodiment, the wafer 20W may comprise a two-dimensional array of packaging substrates 20. In the illustrated example, the wafer 20W comprises a first packaging substrate 201, a second packaging substrate 202, and a third packaging substrate 203 therein. The various packaging substrates 20 may be portions of the wafer 20W that are laterally spaced apart from one another.

In one embodiment, each of the semiconductor packages 10 may comprise package-side bonding structures 18 to which solder material portions 30 are attached. For example, the first semiconductor package 101 may comprise first package-side bonding structures 18 to which first solder material portions 30 are attached, the second semiconductor package 102 may comprise second package-side bonding structures 18 to which second solder material portions 30 are attached, and the third semiconductor package 103 may comprise third package-side bonding structures 18 to which third solder material portions 30 are attached.

In one embodiment, each of the packaging substrates 20 may comprise substrate-side bonding structures 28. For example, the first packaging substrate 201 may comprise first substrate-side bonding structures 28, the second packaging substrate 202 may comprise second substrate-side bonding structures 28, and the third packaging substrate 203 may comprise third substrate-side bonding structures 28.

Generally, the semiconductor packages 10 and the packaging substrates 20 may be loaded into the process chamber (30, 32, 34) while the first door 32 is open. While the present disclosure is described using an embodiment in which solder material portions 30 are attached to semiconductor packages 10, embodiments are expressly contemplated herein in which the solder material portions 30 are attached to the packaging substrates 20.

Figure 3:
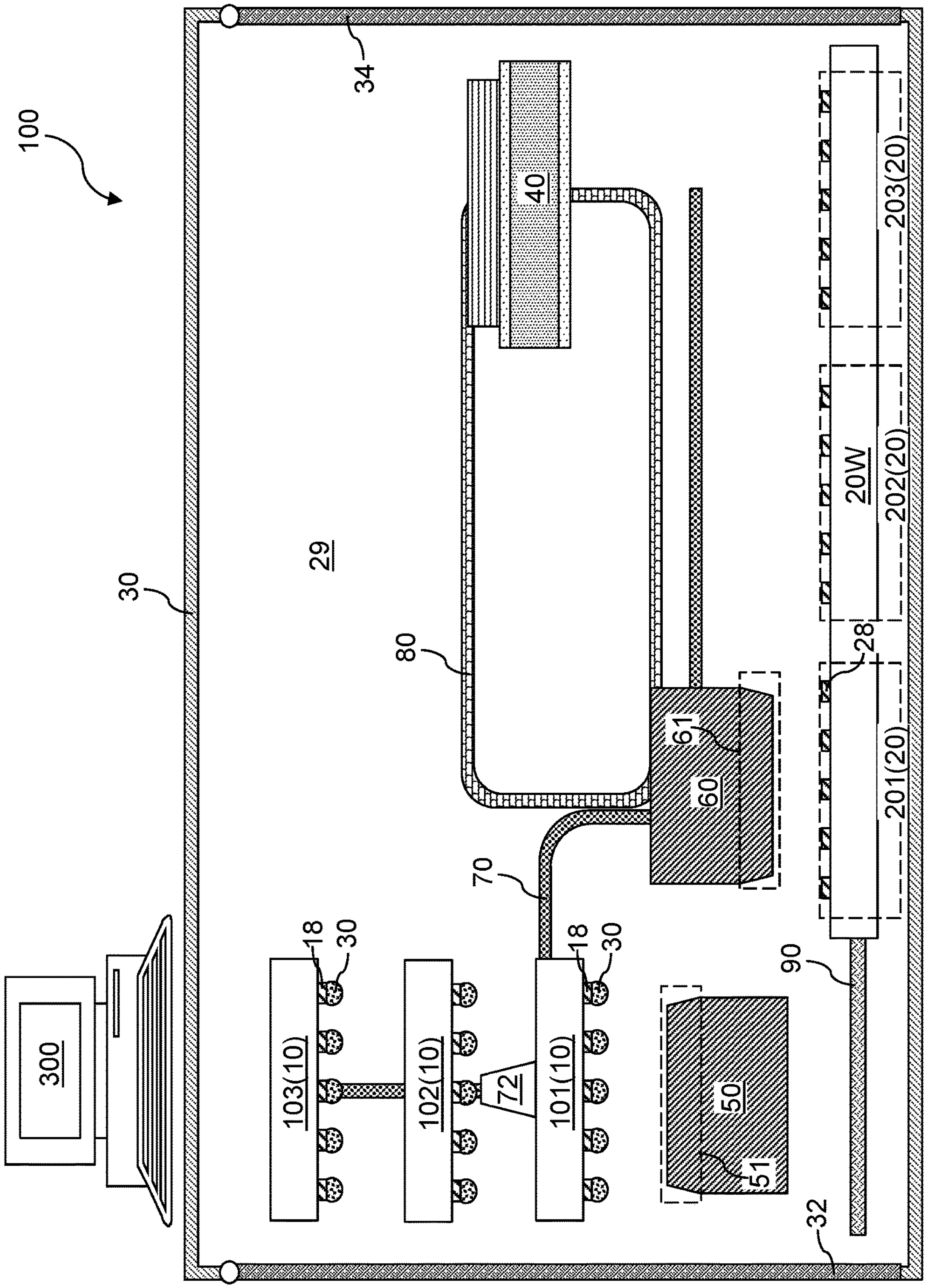
FIG. 3 is a vertical cross-sectional view of the first exemplary apparatus after closing a loading-side door according to an embodiment of the present disclosure.

Referring to FIG. 3, the first door 32 may be closed after loading the semiconductor packages 10 and the packaging substrates 20 into the process chamber (30, 32, 34).

Figure 4:
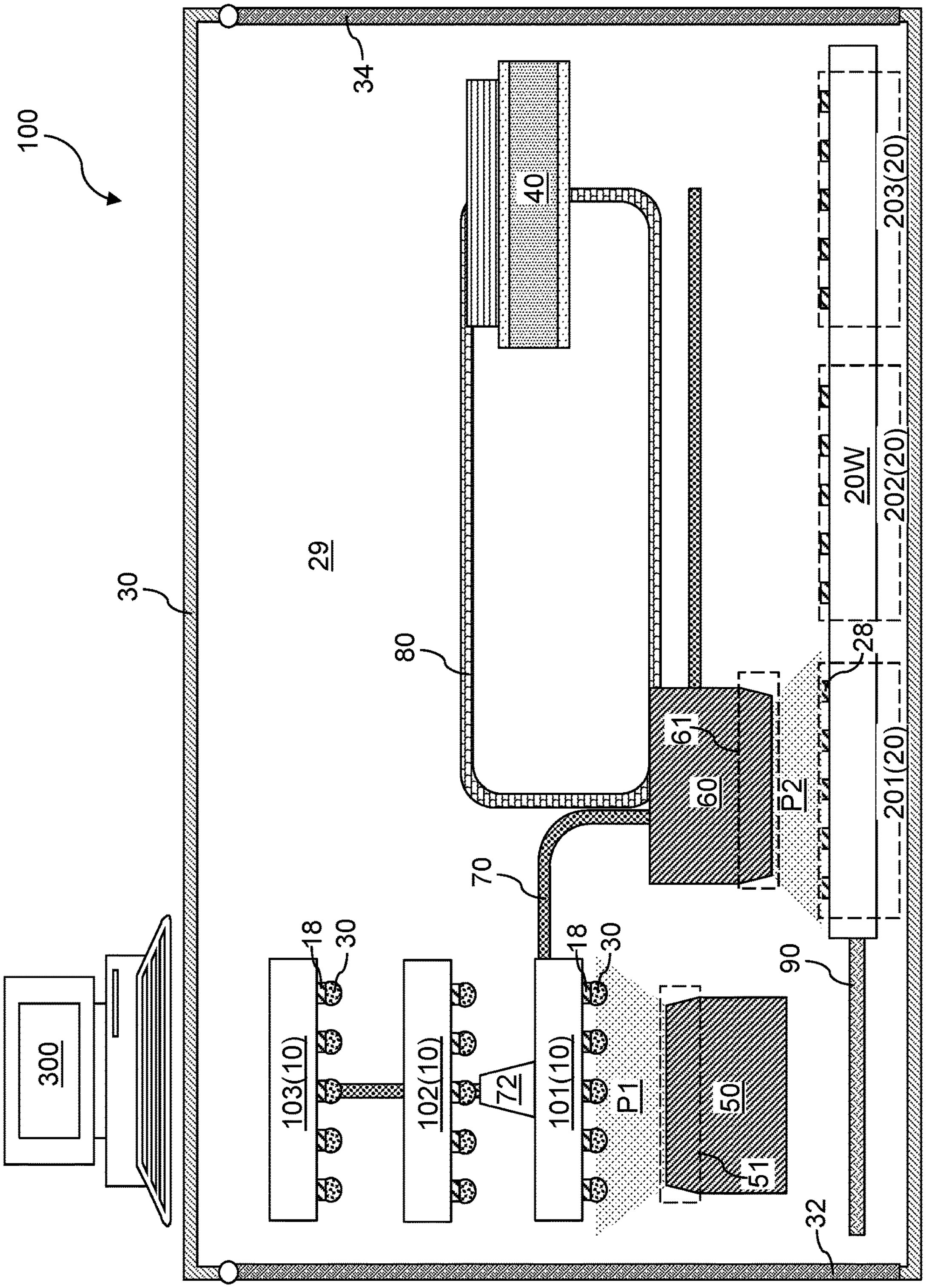
FIG. 4 is a vertical cross-sectional view of the first exemplary apparatus during a processing step that performs a first plasma package-treatment process and a first substrate-treatment process according to an embodiment of the present disclosure.

Referring to FIG. 4, a first plasma package-treatment process and a first substrate-treatment process may be performed simultaneously while the process chamber (30, 32, 34) is sealed after closing the first door 32. The first plasma package-treatment process removes impurities from physically exposed surfaces of the first solder material portions 30 and the first package-side bonding structures 18. The first plasma substrate-treatment process removes impurities from physically exposed surfaces of the first substrate-side bonding structures 28.

Specifically, the first semiconductor package 101 may be positioned such that the first solder material portions 30 of the first semiconductor package 101 faces a plasma nozzle 51 of the first plasma treatment system 50. Generally, the first plasma treatment system 50 may be any plasma treatment system configured to clean surfaces of solder material portions or bonding structures on a semiconductor package. The plasma nozzle 51 of the first plasma treatment system 50 may be a line-type plasma nozzle, a matrix-type plasma nozzle, a round plasma nozzle, a rectangular plasma nozzle, or a plasma nozzle having an irregular shape.

The plasma nozzle 51 of the first plasma treatment system 50 comprises at least one plasma outlet, which may be a plurality of plasma outlets. During the first plasma package-treatment process, the vertical distance between the plasma nozzle 51 of the first plasma treatment system 50 and the first solder material portions 18 on the first semiconductor package 101 may be in a range from 1 mm to 50 mm, although lesser and greater vertical distances may also be used. The lateral extent of the plasma outlet of the plasma nozzle 51 may be less than the lateral extent of the first solder material portions 30 attached to the first semiconductor package 101. In an illustrative example, the lateral offset distance between the outermost edge of the solder material portions 30 and a most proximal portion of the plasma outlet of the plasma nozzle 51 may be in a range from 1 mm to 200 mm, although lesser and greater lateral offset distances may also be used.

The plasma nozzle 61 of the second plasma treatment system 60 comprises at least one plasma outlet, which may be a plurality of plasma outlets. During the first plasma substrate-treatment process, the vertical distance between the plasma nozzle 61 of the second plasma treatment system 60 and the first substrate-side bonding structures 28 on the first packaging substrate 201 may be in a range from 1 mm to 60 mm, although lesser and greater vertical distances may also be used. The lateral extent of the plasma outlet of the plasma nozzle 61 may be less than the lateral extent of the first substrate-side bonding structures 28 attached to the first packaging substrate 201. In an illustrative example, the lateral offset distance between the outermost edge of the first substrate-side bonding structures 28 and a most proximal portion of the plasma outlet of the plasma nozzle 61 may be in a range from 1 mm to 200 mm, although lesser and greater lateral offset distances may also be used.

The first plasma treatment system 50 forms a first plasma P1 around the first solder material portions 18 by generating a first atmospheric pressure plasma jet (APPJ). The second plasma treatment system 60 forms a second plasma over the first substrate-side bonding structures 28 on the first packaging substrate 201 by generating a second APPJ jet. Generally, an atmospheric pressure plasma jet (APPJ) can be generated by passing a gas (such as air, argon, or helium) through a high voltage electrical discharge. The resulting plasma is composed of highly reactive species, such as ions and radicals, which can be used for a variety of industrial and research applications. In one embodiment of the present disclosure, the first APPJ and the second APPJ are employed for surface cleaning. Specifically, ions in the first plasma P1 are directed towards the first solder material portions 18 to clean the surfaces of the first solder material portions 18, and ions in the second plasma P2 are directed towards the first substrate-side bonding structures 28 to clean the surfaces of the first substrate-side bonding structures 28. The high energy species in the plasma interact with the surfaces, thereby breaking down, and removing, contaminants on the first solder material portions 18. In one embodiment, the first plasma P1 and the second plasma P use ions of a reducing gas to reduce and/or remove contaminants (such as oxygen or water vapor) on the surfaces of the first solder material portions 18 and the first substrate-side bonding structures 28. A reducing gas is mixed with the respective plasma (P1, P2), and the resulting reactive species are directed towards the surfaces to be cleaned, effectively reducing and removing the contaminants on the surfaces.

Exemplary reducing gases that may be employed to form the first plasma P1 and the second plasma P2 from the first plasma treatment system 50 and the second plasma treatment system 60, respectively, may include, but are not limited, to hydrogen, various hydride gases (such as methane, ammonia, acetylene, etc.), carbon monoxide, and various volatile compounds including hydrogen radicals. Hydrogen gas is a strong reducing agent and can be used to remove oxides, sulfates, and other contaminants from surfaces. Methane is a hydrocarbon gas that can be used to remove carbon-based contaminants from surfaces. Ammonia is a weak reducing agent that can be used to remove nitrides and other nitrogen-based contaminants from surfaces. Carbon dioxide can be used to remove organic contaminants from surfaces. Nitrogen can be employed to remove oxygen-based contaminants. Propane is a hydrocarbon gas that can be used to remove carbon-based contaminants from surfaces. In some other embodiments, non-reducing gases such as argon and helium may be optionally used to cool down the plasma, and/or to protect the plasma jet and to improve the plasma properties. Generally, any ion that acts as a reducing agent may be employed. The atmospheric pressure plasma jets generated by the first plasma treatment system 50 and the second plasma treatment system 60 does not need to be at an "atmospheric" pressure, but may be any pressure that can be employed to generate the condition of an atmospheric pressure plasma jet known in the art.

The temperature of the low-oxygen ambient 29 in the process chamber (30, 32, 34) is lower than the reflow temperature of the solder material portions 30. The temperature of the low-oxygen ambient 29 may be in range from 10 degrees Celsius to 450 degrees Celsius, and may be in a range from 10 degrees Celsius to 200 degrees Celsius, such as from 10 degrees Celsius to 100 degrees Celsius. Generally, the first plasma package-treatment process and the first substrate-treatment process may be performed simultaneously, i.e., during a same processing step. Thus, the first plasma package-treatment process may be performed on the first semiconductor package 101 in the low-oxygen ambient 29 having an oxygen partial pressure that is lower than 17 kPa while performing the first substrate-treatment process on the first packaging substrate 201 in the low-oxygen ambient 29.

In the first embodiment, a low-oxygen ambient 29 is provided within a process chamber (30, 32, 34) comprising a chamber enclosure 30 that comprises a chamber opening and a door 32 configured to fit the chamber opening. In embodiments in which the first semiconductor package 101 comprises first package-side bonding structures 18 to which first solder material portions 30 are attached, the first plasma package-treatment process cleans the first solder material portions 30. In embodiments in which the first packaging substrate 201 comprise first substrate-side bonding structures 28, the first substrate-treatment process cleans the first substrate-side bonding structures 28.

Generally, the process controller 300 comprises a processor and a memory in communication with the processor, and is loaded with a program that simultaneously performs the first plasma package-treatment process on the first semiconductor package 101 and the first substrate-treatment process on the first packaging substrate 201 within the wafer 20W.

Figure 5:
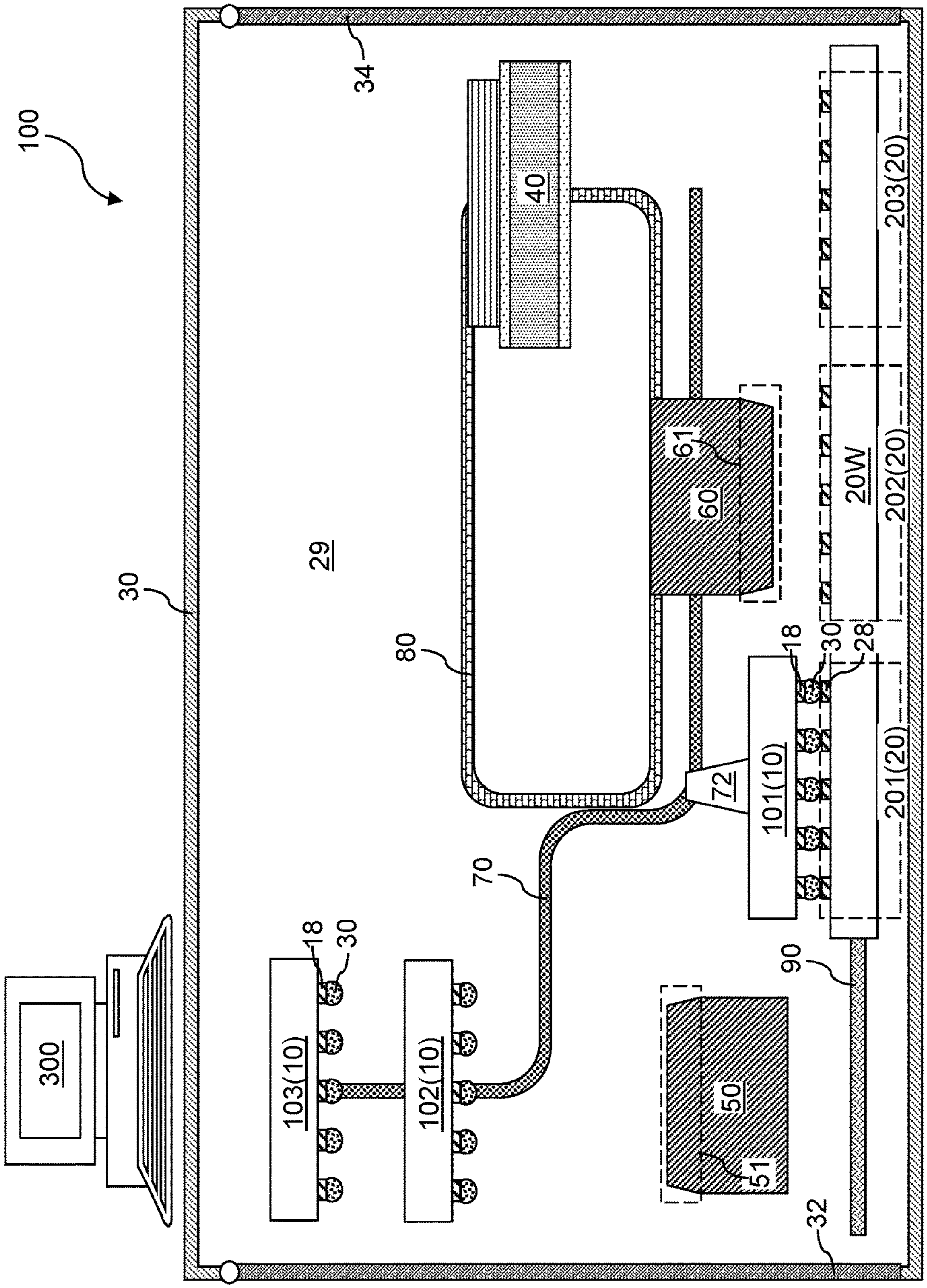
FIG. 5 is a vertical cross-sectional view of the first exemplary apparatus after transporting a first semiconductor package to a position overlying a first packaging substrate according to an embodiment of the present disclosure.

Referring to FIG. 5, the second plasma treatment system 60 may move over along the first transport path 70 until the second plasma treatment system 60 faces the second packaging substrate 202. Further, the first semiconductor package 101 may be transported to a position overlying the first packaging substrate 201 using the first transport system (70, 72). For example, the package handler 72 may grasp the first semiconductor package 101 and move along the first transport path 70, and position the first semiconductor package 101 such that the first solder material portions 30 on the first semiconductor package 101 faces a respective one of the first substrate-side bonding structures 28 (which may comprise bonding pads) on the first packaging substrate 201.

Figure 6:
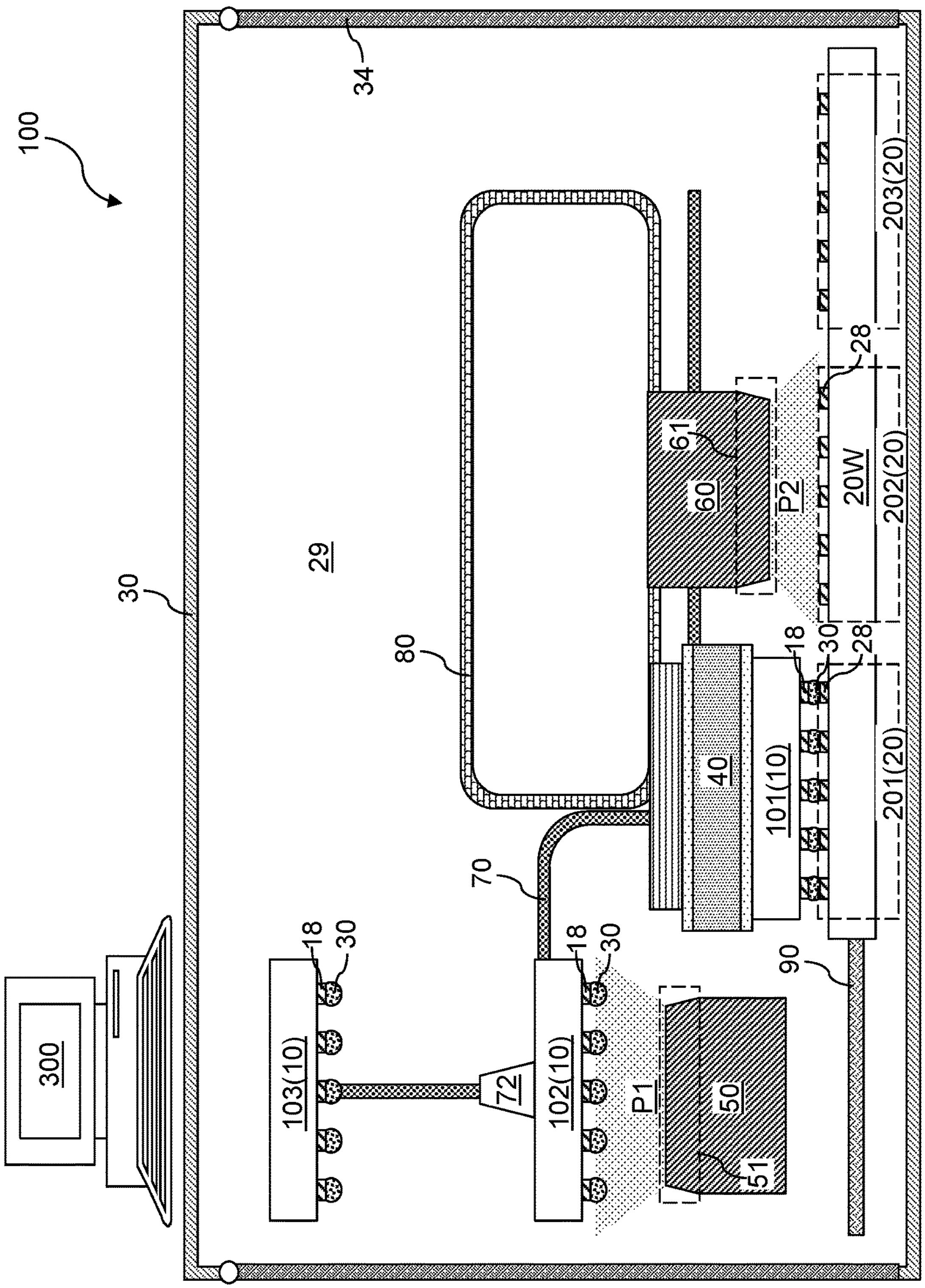
FIG. 6 is a vertical cross-sectional view of the first exemplary apparatus during a processing step that performs a first bonding process, a second plasma package-treatment process, and a second substrate-treatment process according to an embodiment of the present disclosure.

Referring to FIG. 6, the second semiconductor package 102 may be transported to a cleaning position, which is a position that faces the plasma nozzle 51 of the first plasma treatment system 50. The thermocompressive bonding head 40 may move along a transport path in the second transport system 80, and may be placed in a position that overlies the first semiconductor package 101. Generally, movement of all mechanical components within the process chamber (30, 32, 34) may be controlled by the process controller 300.

A first bonding process may be performed using the thermocompressive bonding head 40 to bond the first semiconductor package 101 to the first packaging substrate 201 located in the wafer 20W. The first solder material portions 30 may reflow during the first bonding process such that each first solder material portion 30 is boned to a respective one of the first package-side bonding structures 18 on the first semiconductor package 101 and to a respective one of the first substrate-side bonding structures 28 on the first packaging substrate 201.

A second plasma package-treatment process and a second substrate-treatment process may be performed simultaneously while the first bonding process proceeds. Generally, the commencement of the second plasma package-treatment process may precede, may be simultaneous with, or may follow, the commencement of the first bonding process. Further, the commencement of the second plasma substrate-treatment process may precede, may be simultaneous with, or may follow, the commencement of the first bonding process. In addition, the commencement of the second plasma substrate-treatment process may precede, may be simultaneous with, or may follow, the commencement of the second plasma package-treatment process. Generally, a duration of time exists during which the second plasma package-treatment process, the second substrate-treatment process, and the first bonding process proceed simultaneously.

The second plasma package-treatment process removes impurities from physically exposed surfaces of the second solder material portions 30 and the second package-side bonding structures 18 that are located on the second semiconductor package 102. The second plasma substrate-treatment process removes impurities from physically exposed surfaces of the second substrate-side bonding structures 28 on the second packaging substrate 202. The second plasma package-treatment process may be substantially the same as the first plasma package-treatment process except that the second plasma package-treatment process is performed on the second semiconductor package 102 in lieu of the first semiconductor package 101. The second plasma substrate-treatment process may be substantially the same as the first plasma substrate-treatment process except that the second plasma substrate-treatment process is performed on the second packaging substrate 202 in lieu of the first packaging substrate 201.

According to an aspect of the present disclosure, the first bonding process, the second plasma package-treatment process, and the second substrate-treatment process may be performed simultaneously during a processing step. Thus, the second plasma package-treatment process may be performed on the second semiconductor package 102 while performing the second substrate-treatment process on the second packaging substrate 202 and while bonding the first semiconductor package 101 to the first packaging substrate 201. The first semiconductor package 101 is bonded to the first packaging substrate 201 by reflowing the first solder material portions 30 in the low-oxygen ambient 29.

In one embodiment, the process controller 300 may be configured to simultaneously perform a bonding operation on a combination of the first semiconductor package 101 and the first packaging substrate 201, a plasma package-treatment process on the second semiconductor package 102, and a substrate-treatment process on the second packaging substrate 202 within the wafer 20W after simultaneously performing the first plasma package-treatment process and the first substrate-treatment process.

Figure 7:
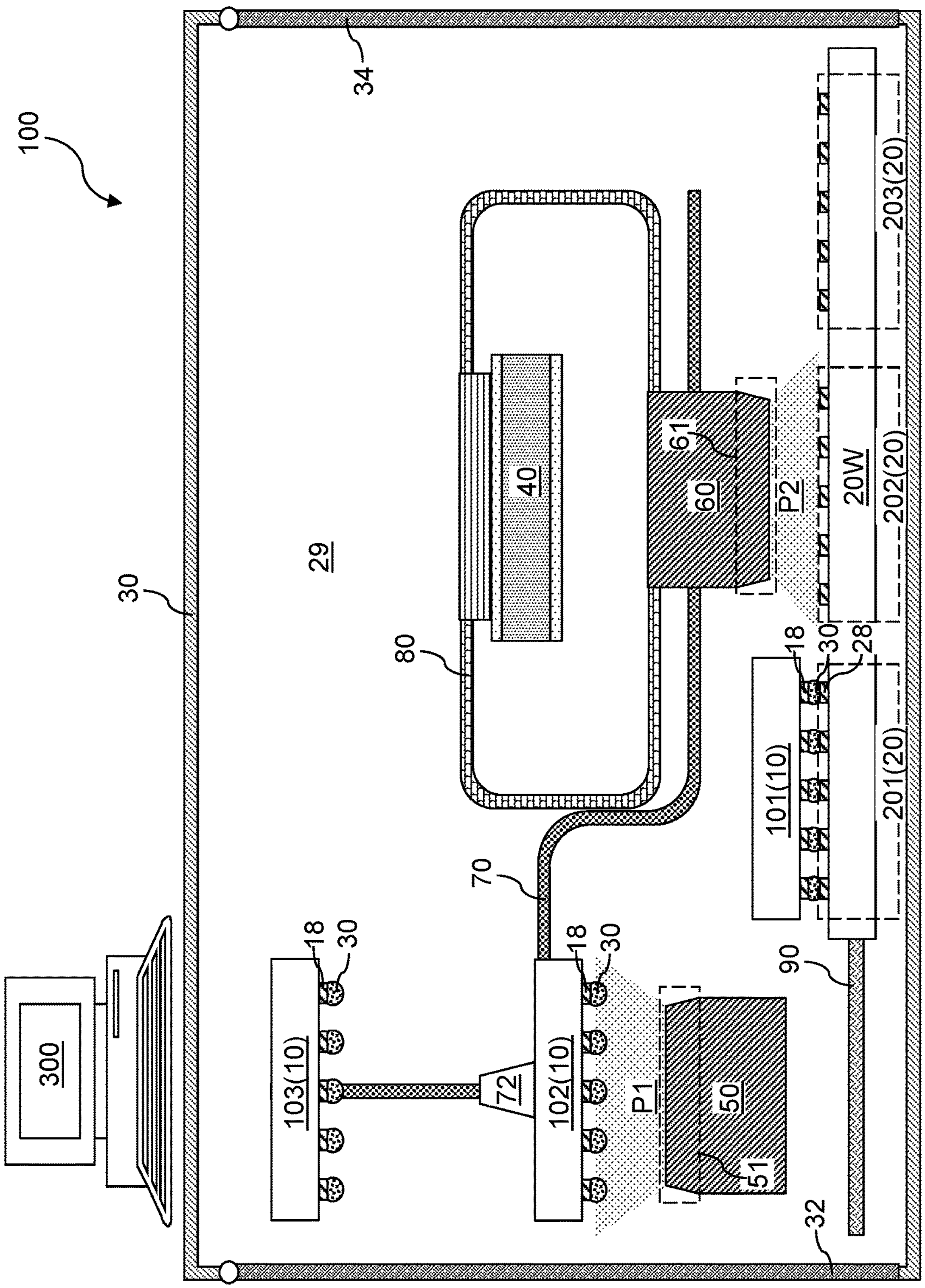
FIG. 7 is a vertical cross-sectional view of the first exemplary apparatus after moving a thermocompressive bonding head away from a first bonded assembly according to an embodiment of the present disclosure.

Referring to FIG. 7, the first bonding process may be completed, and the thermocompressive bonding head 40 may be moved away from a first bonded assembly of the first semiconductor package 101 and the first packaging substrate 201, for example, using the second transport system 80. If necessary, the second plasma package-treatment process and/or the second substrate-treatment process may be continued while the thermocompressive bonding head 40 moves away from the first bonded assembly.

Figure 8:
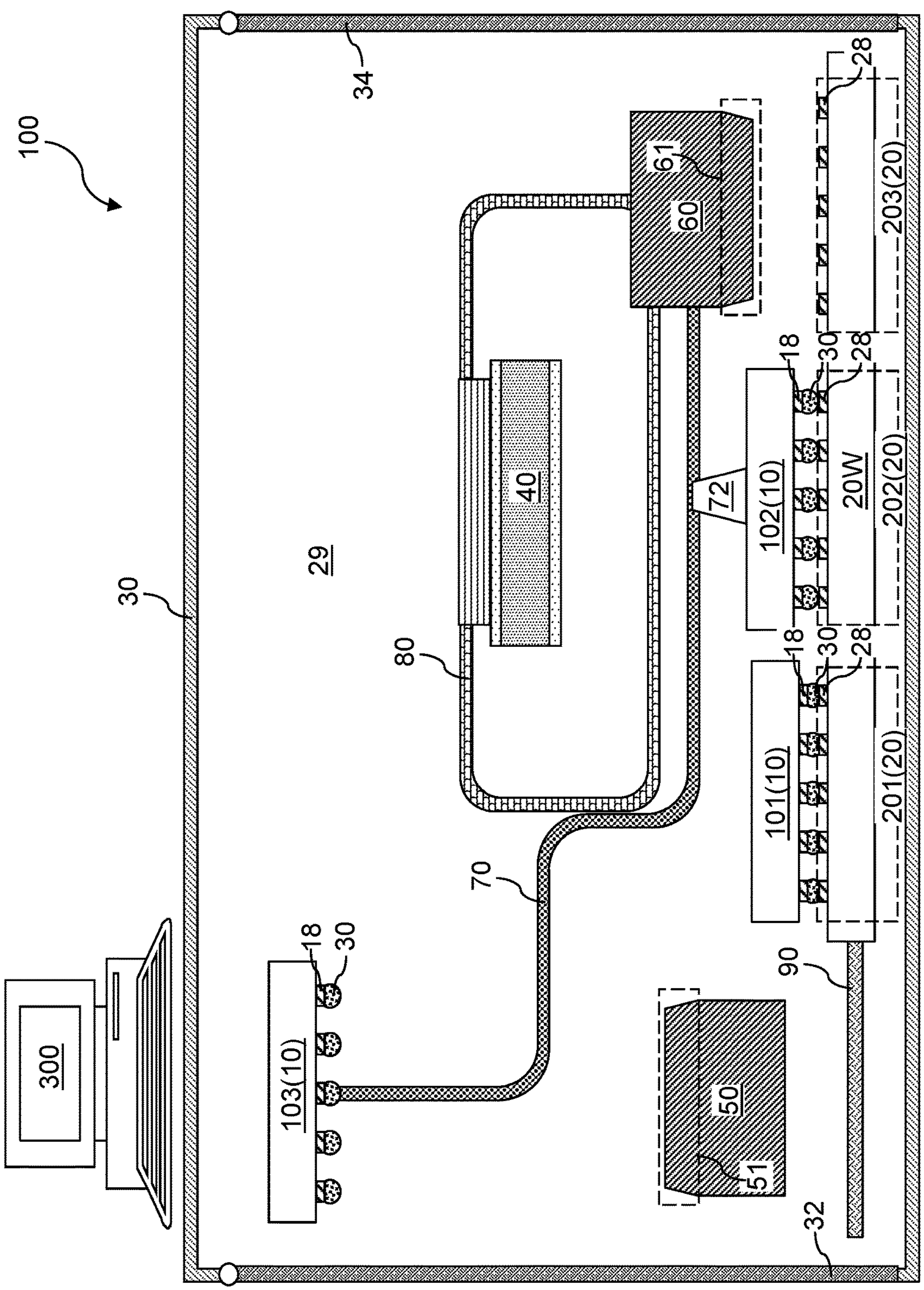
FIG. 8 is a vertical cross-sectional view of the first exemplary apparatus after transporting a second semiconductor package to a position overlying a second packaging substrate according to an embodiment of the present disclosure.

Referring to FIG. 8, the second plasma treatment system 60 may move over along the first transport path 70 until the second plasma treatment system 60 faces the third packaging substrate 203. Further, the second semiconductor package 102 may be transported to a position overlying the second packaging substrate 202 using the first transport system (70, 72). For example, the package handler 72 may grasp the second semiconductor package 102 and move along the first transport path 70, and position the second semiconductor package 102 such that the second solder material portions 30 on the second semiconductor package 102 faces a respective one of the second substrate-side bonding structures 28 (which may comprise bonding pads) on the second packaging substrate 202.

Figure 9:
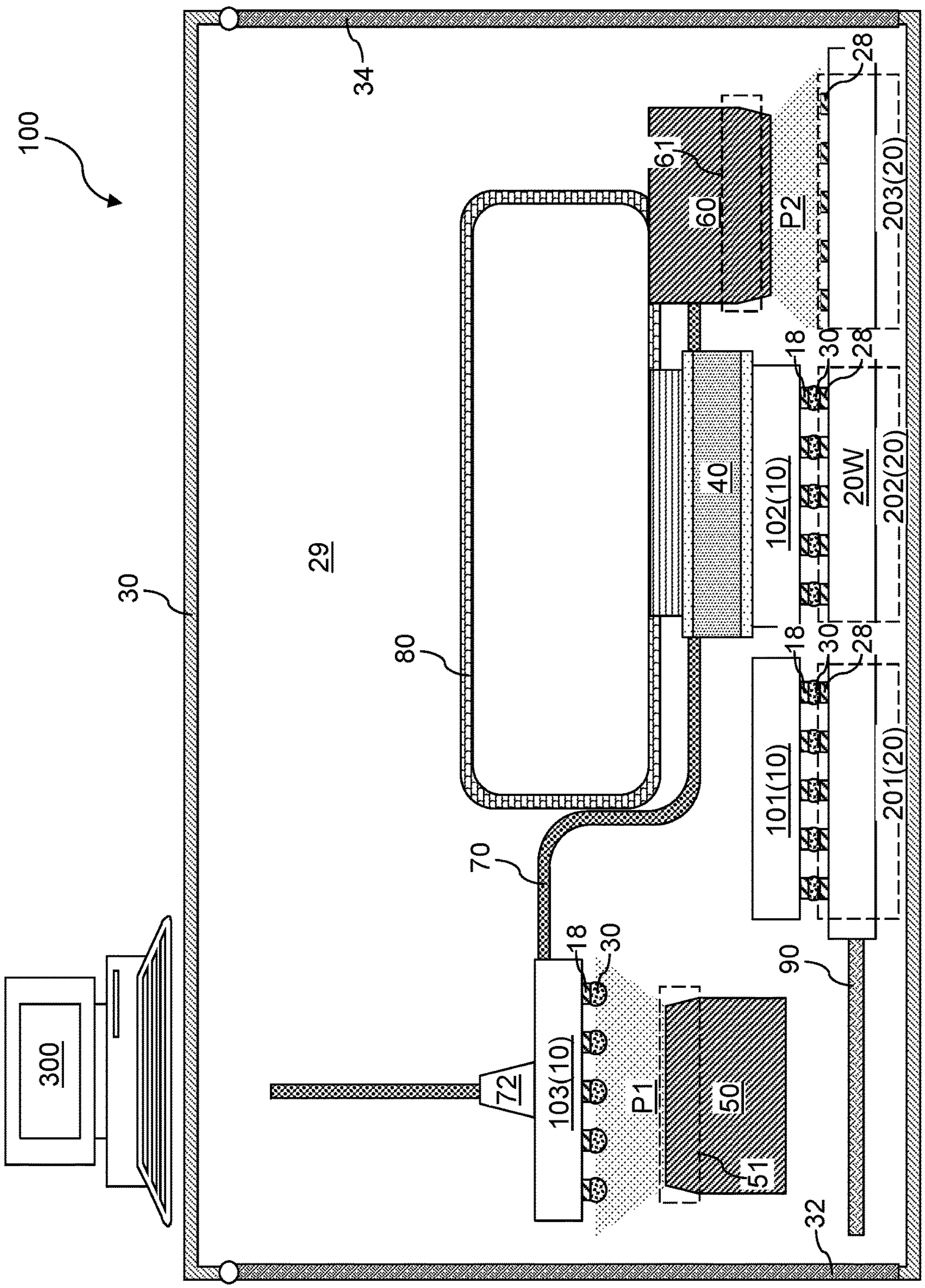
FIG. 9 is a vertical cross-sectional view of the first exemplary apparatus during a processing step that performs a second bonding process, a third plasma package-treatment process, and a third substrate-treatment process according to an embodiment of the present disclosure.

Referring to FIG. 9, the third semiconductor package 103 may be transported to a cleaning position, which is a position that faces the plasma nozzle 51 of the first plasma treatment system 50. The thermocompressive bonding head 40 may move along the transport path in the second transport system 80, and may be placed in a position that overlies the second semiconductor package 102. Generally, movement of all mechanical components within the process chamber (30, 32, 34) may be controlled by the process controller 300.

A second bonding process may be performed using the thermocompressive bonding head 40 to bond the second semiconductor package 102 to the second packaging substrate 202 located in the wafer 20W. The second solder material portions 30 may reflow during the second bonding process such that each second solder material portion 30 is boned to a respective one of the second package-side bonding structures 18 on the second semiconductor package 102 and to a respective one of the second substate-side bonding structures 28 on the second packaging substrate 202.

A third plasma package-treatment process and a third substrate-treatment process may be performed simultaneously while the second bonding process proceeds. Generally, the commencement of the third plasma package-treatment process may precede, may be simultaneous with, or may follow, the commencement of the second bonding process. Further, the commencement of the third plasma substrate-treatment process may precede, may be simultaneous with, or may follow, the commencement of the second bonding process. In addition, the commencement of the third plasma substrate-treatment process may precede, may be simultaneous with, or may follow, the commencement of the third plasma package-treatment process. Generally, a duration of time exists during which the third plasma package-treatment process, the third substrate-treatment process, and the second bonding process proceed simultaneously.

The third plasma package-treatment process removes impurities from physically exposed surfaces of the third solder material portions 30 and the third package-side bonding structures 18 that are located on the third semiconductor package 103. The third plasma substrate-treatment process removes impurities from physically exposed surfaces of the third substrate-side bonding structures 28 on the third packaging substrate 203. The third plasma package-treatment process may be substantially the same as the first plasma package-treatment process except that the third plasma package-treatment process is performed on the third semiconductor package 103 in lieu of the first semiconductor package 101. The third plasma substrate-treatment process may be substantially the same as the first plasma substrate-treatment process except that the third plasma substrate-treatment process is performed on the third packaging substrate 203 in lieu of the first packaging substrate 201.

According to an aspect of the present disclosure, the second bonding process, the third plasma package-treatment process, and the third substrate-treatment process may be performed simultaneously during a processing step. Thus, the third plasma package-treatment process may be performed on the third semiconductor package 103 while performing the third substrate-treatment process on the third packaging substrate 203 and while bonding the second semiconductor package 102 to the second packaging substrate 202. The second semiconductor package 102 is bonded to the second packaging substrate 202 by reflowing the second solder material portions 30 in the low-oxygen ambient 29.

In one embodiment, the process controller 300 may be configured to simultaneously perform a bonding operation on a combination of the second semiconductor package 102 and the second packaging substrate 202, a plasma package-treatment process on the third semiconductor package 103, and a substrate-treatment process on the third packaging substrate 203 within the wafer 20W after simultaneously performing the first bonding process, the second plasma package-treatment process, and the second substrate-treatment process.

Figure 10:
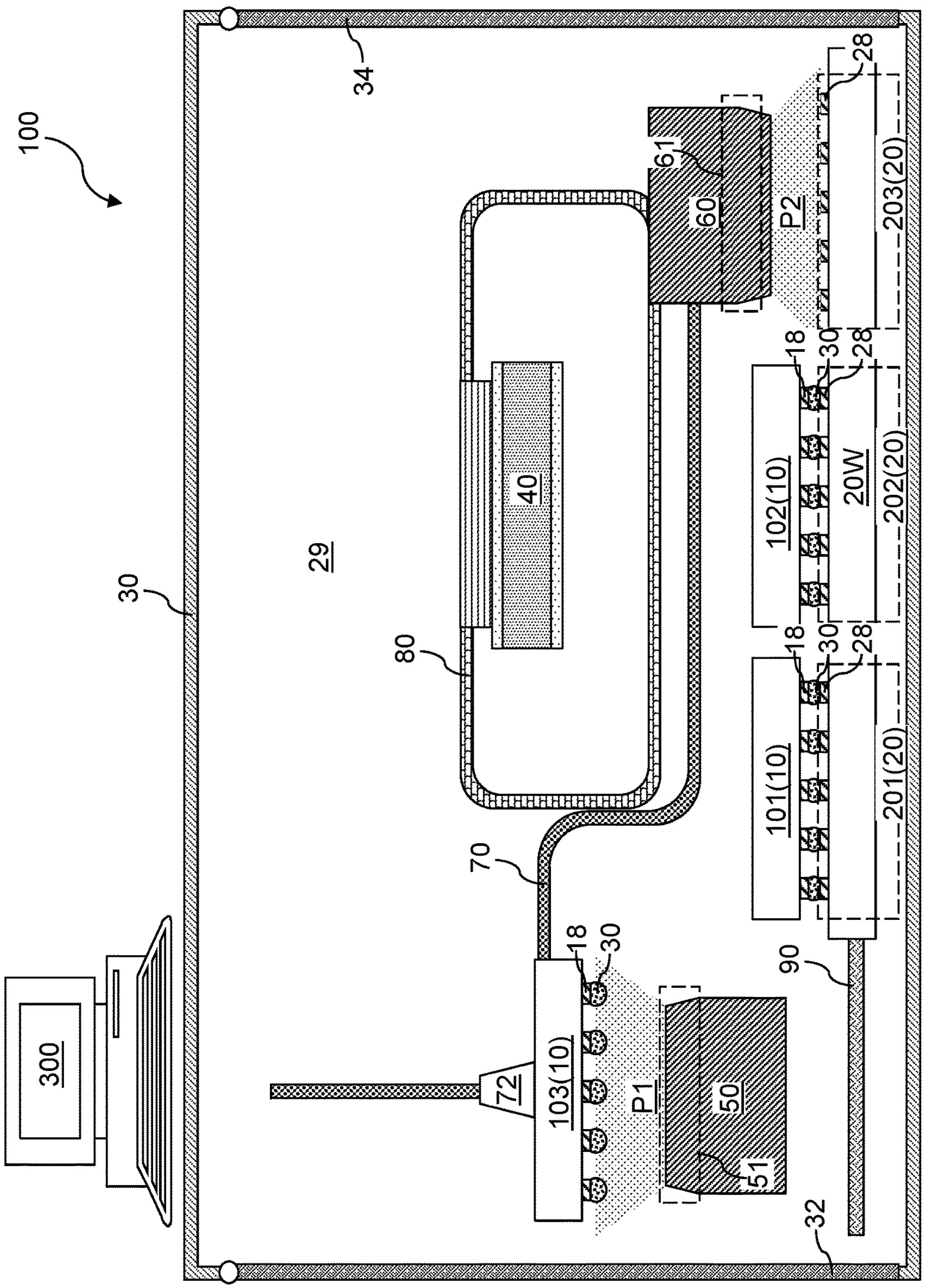
FIG. 10 is a vertical cross-sectional view of the first exemplary apparatus after moving the thermocompressive bonding head away from a second bonded assembly according to an embodiment of the present disclosure.

Referring to FIG. 10, the second bonding process may be completed, and the thermocompressive bonding head 40 may be moved away from a second bonded assembly of the second semiconductor package 102 and the second packaging substrate 202, for example, using the second transport system 80. If necessary, the third plasma package-treatment process and/or the third substrate-treatment process may be continued while the thermocompressive bonding head 40 moves away from the second bonded assembly.

Figure 11:
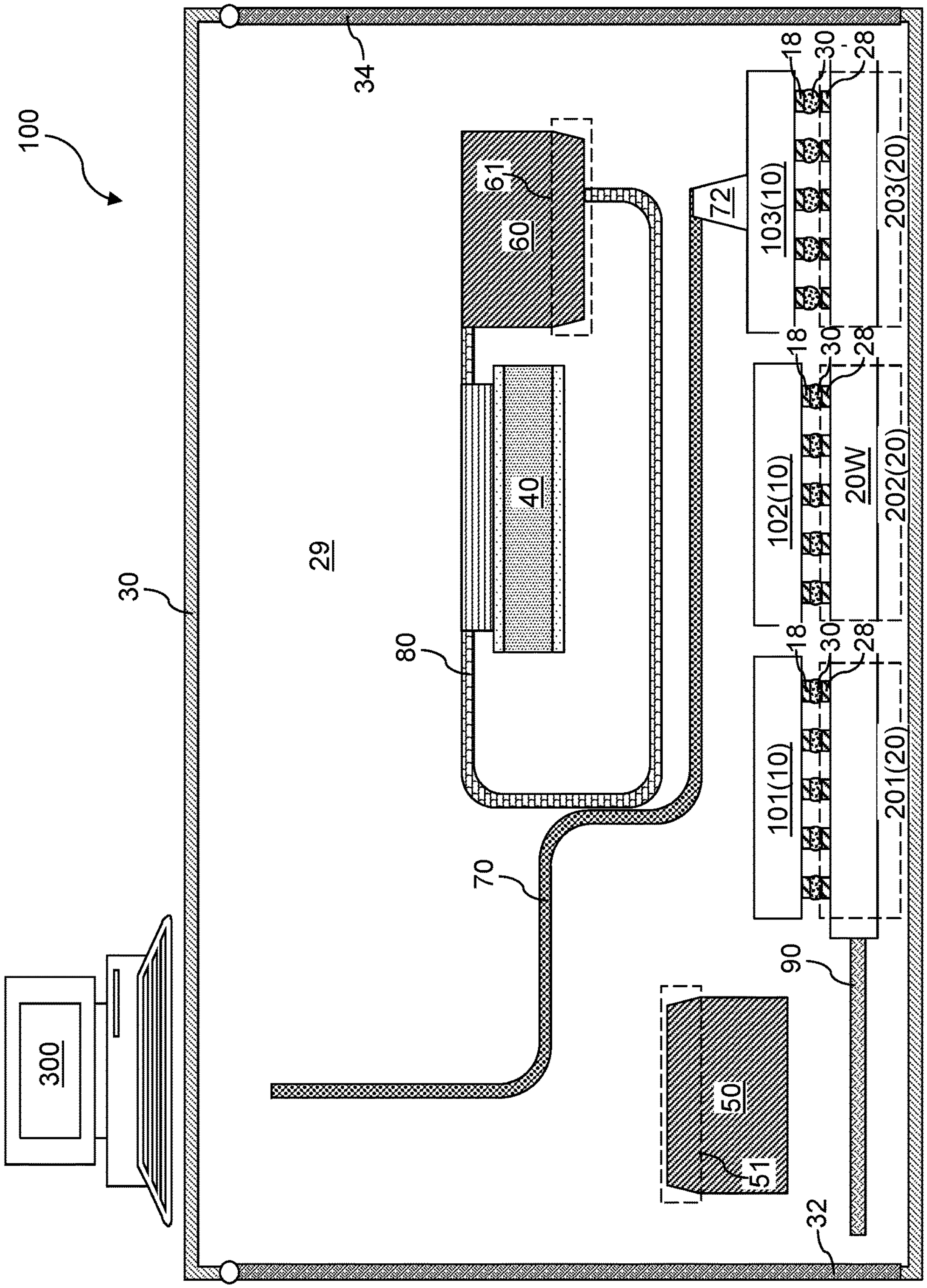
FIG. 11 is a vertical cross-sectional view of the first exemplary apparatus after transporting a third semiconductor package to a position overlying a third packaging substrate according to an embodiment of the present disclosure.

Referring to FIG. 11, the second plasma treatment system 60 may move over along the first transport path 70 away from the third packaging substrate 203. The third semiconductor package 103 may be transported to a position overlying the third packaging substrate 203 using the first transport system (70, 72). For example, the package handler 72 may grasp the third semiconductor package 103 and move along the first transport path 70, and position the third semiconductor package 103 such that the second solder material portions 30 on the third semiconductor package 103 faces a respective one of the third substrate-side bonding structures 28 (which may comprise bonding pads) on the third packaging substrate 203.

Figure 12:
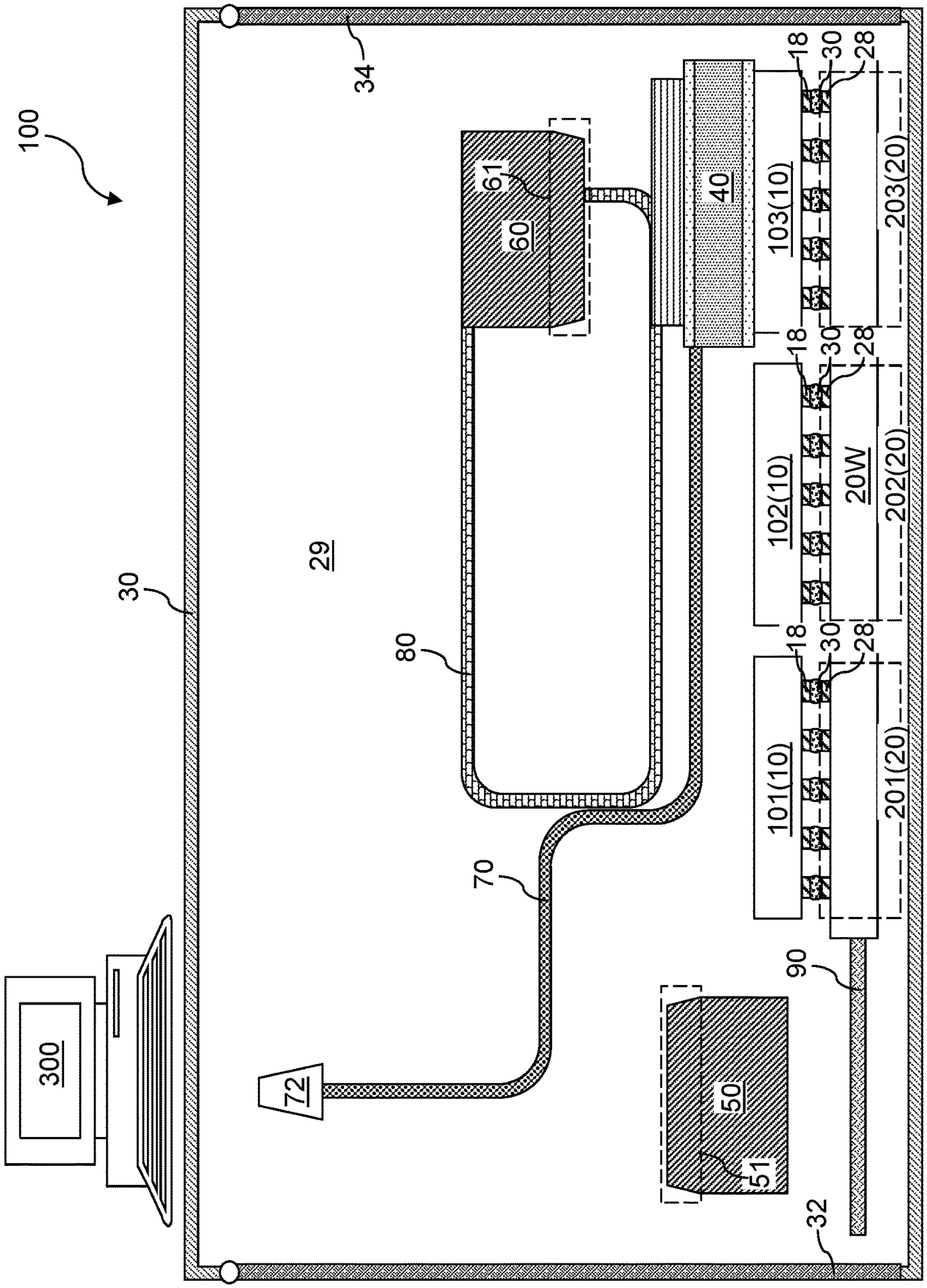
FIG. 12 is a vertical cross-sectional view of the first exemplary apparatus during a processing step that performs a third bonding process according to an embodiment of the present disclosure.

Referring to FIG. 12, the thermocompressive bonding head 40 may move along the transport path in the second transport system 80, and may be placed in a position that overlies the third semiconductor package 103. Generally, movement of all mechanical components within the process chamber (30, 32, 34) may be controlled by the process controller 300.

A third bonding process is performed using the thermocompressive bonding head 40 to bond the third semiconductor package 103 to the third packaging substrate 203 located in the wafer 20W. The third solder material portions 30 may reflow during the third bonding process such that each third solder material portion 30 is boned to a respective one of the third package-side bonding structures 18 on the third semiconductor package 103 and to a respective one of the third substate-side bonding structures 28 on the third packaging substrate 203.

Generally, each packaging substrate 20 in the wafer 20W may be bonded to a respective one of the semiconductor packages 10 that are loaded into the process chamber (30, 32, 34).

Figure 13:
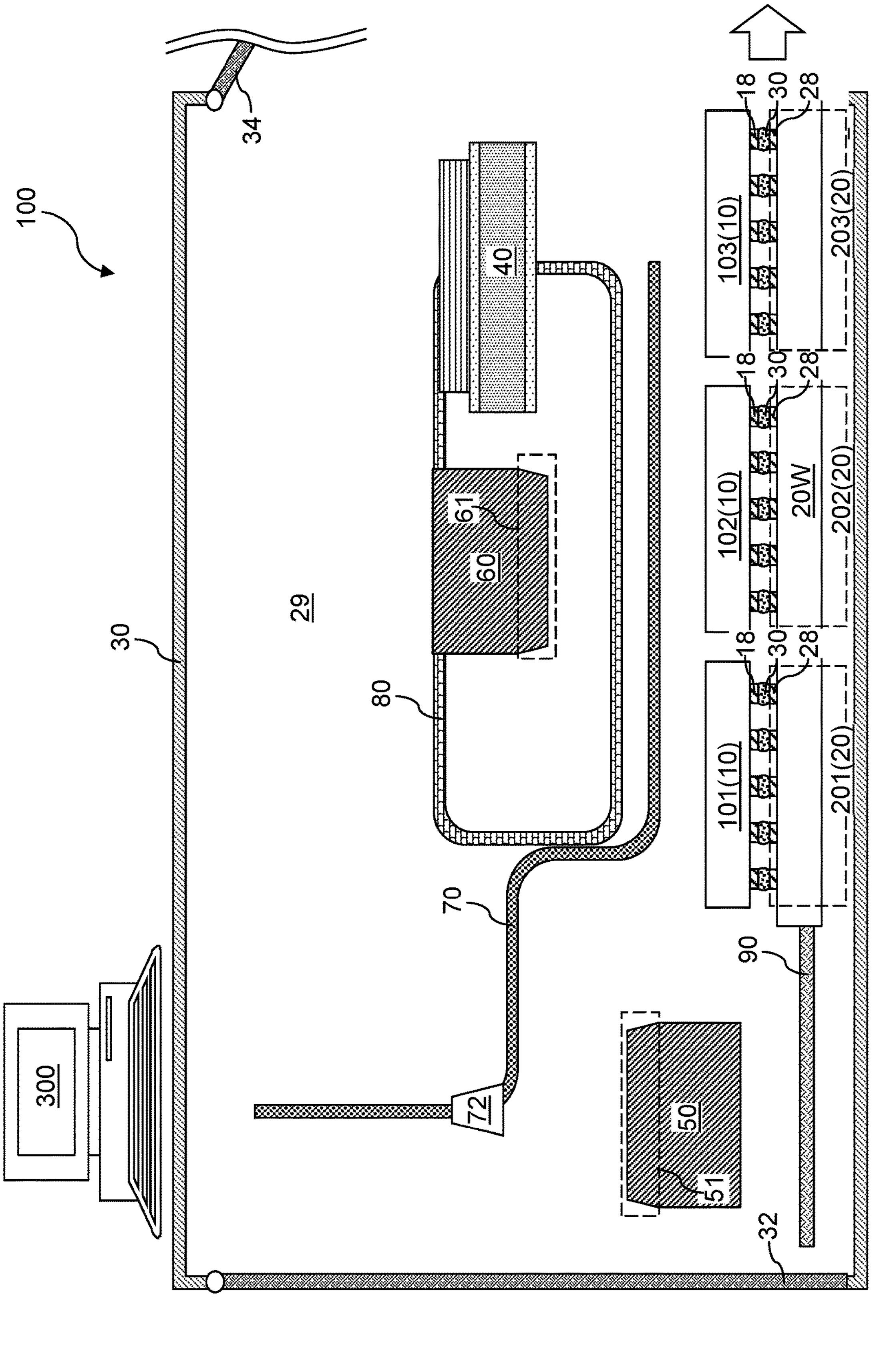
FIG. 13 is a vertical cross-sectional view of the first exemplary apparatus during unloading of an assembly of semiconductor packages and packaging substrates according to an embodiment of the present disclosure.

Referring to FIG. 13, the second door 34 of the process chamber (30, 32, 34) may be opened, and the assemblies of a respective pair of a semiconductor package 10 and a packaging substrate 20 may be unloaded from the process chamber (30, 32, 34). In embodiments in which the packaging substrates 20 are provided as portions of a wafer 20W, the assembly of the wafer 20W and a two-dimensional array of semiconductor packages 10 may be unloaded.

Figure 14:
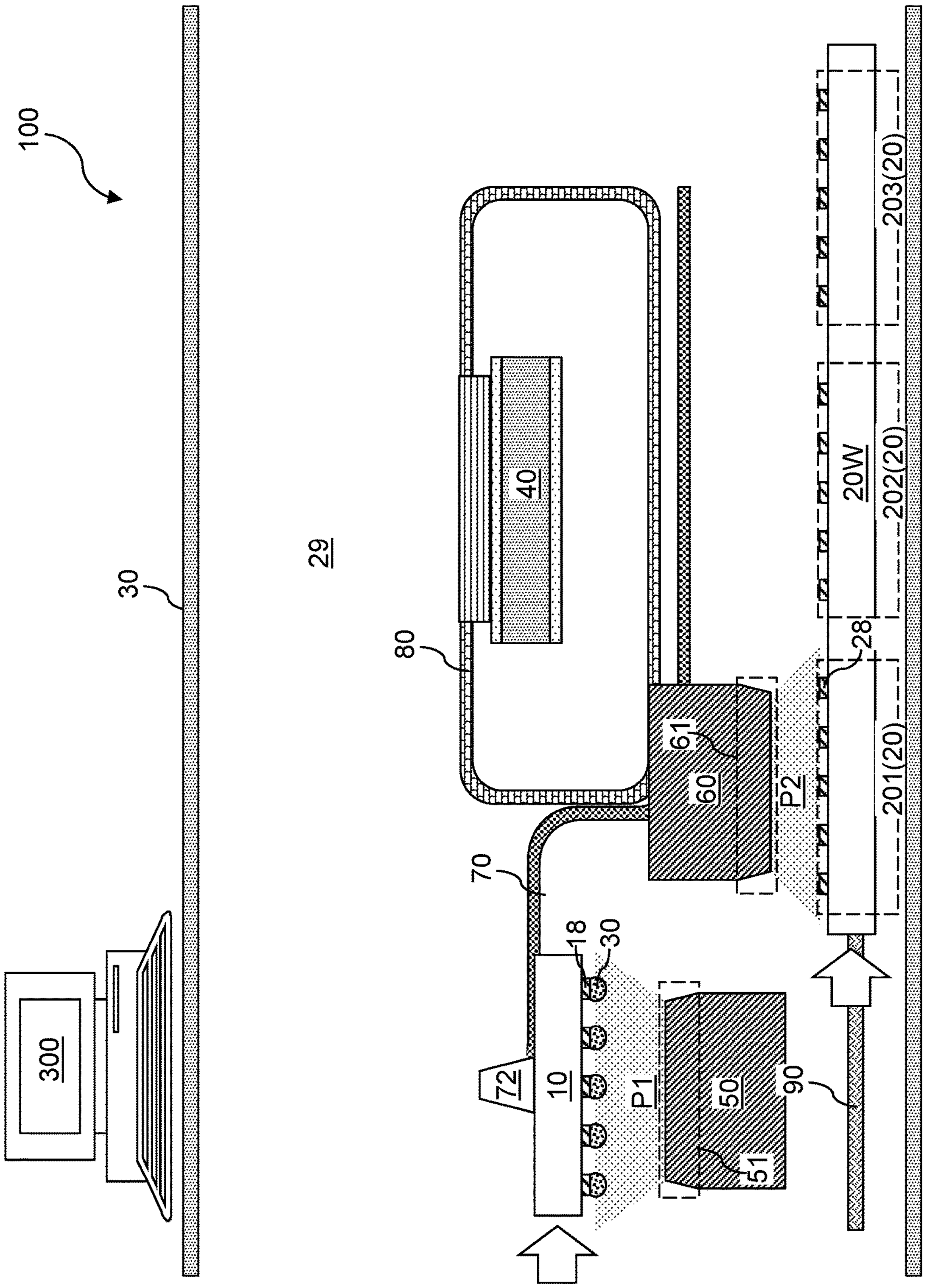
FIG. 14 is a vertical cross-sectional view of a second exemplary apparatus during a processing step that performs a first plasma package-treatment process and a first substrate-treatment process according to an embodiment of the present disclosure.

Referring to FIG. 14, a second exemplary apparatus 100 according to a second embodiment of the present disclosure may be derived from the first exemplary apparatus 100 by removing the first door 32 and the second door 34, and by enabling continuous transport of semiconductor dies 10 into the low-oxygen ambient 29. In this embodiment, the packaging substrates 20 may be loaded into the low-oxygen ambient 29 in the form of a wafer 20W. The semiconductor packages 10 may be transported into the low-oxygen ambient 29 one by one. The processing steps described with reference to FIGS. 4-13 may be performed mutatis mutandis to sequentially bond semiconductor packages 10 to a respective one of the packaging substrates 20. The configuration illustrated in FIG. 14 corresponds to the processing step described with reference to FIG. 4. During operation of the second exemplary apparatus 100, the semiconductor packages 10 may be sequentially transported into the low-oxygen ambient 29 at different times prior to commencement of a respective plasma package-treatment process on a respective semiconductor package 10.

Figure 15:
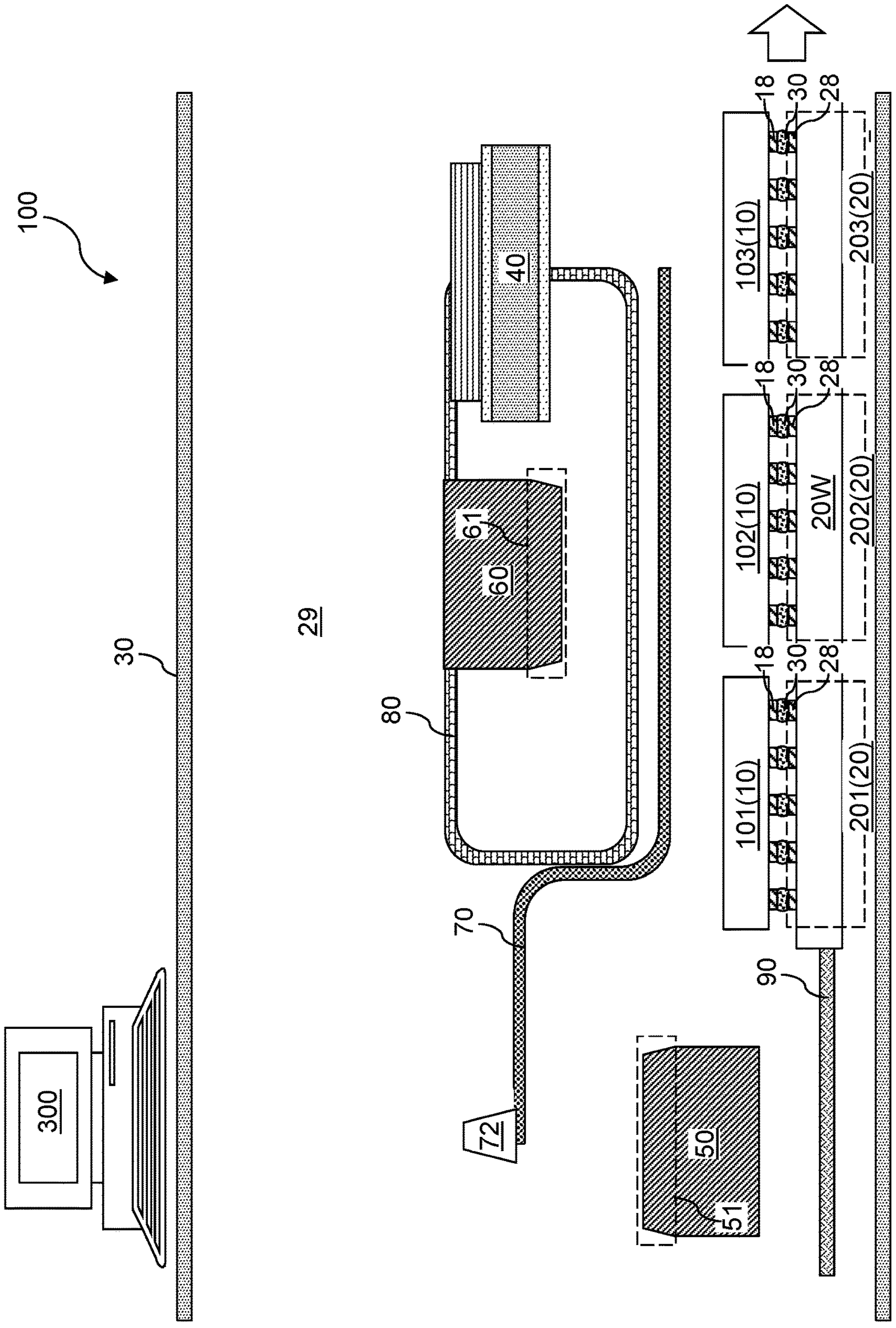
FIG. 15 is a vertical cross-sectional view of the second exemplary apparatus during unloading an assembly of semiconductor packages and packaging substrates according to an embodiment of the present disclosure.

Referring to FIG. 15, a bonded assembly of a wafer 20W and a two-dimensional array of semiconductor packages 10 may be transported out of the low-oxygen ambient 29 upon bonding a semiconductor package 10 to each of the packaging substrates 20 on the wafer 20W.

Figure 16:
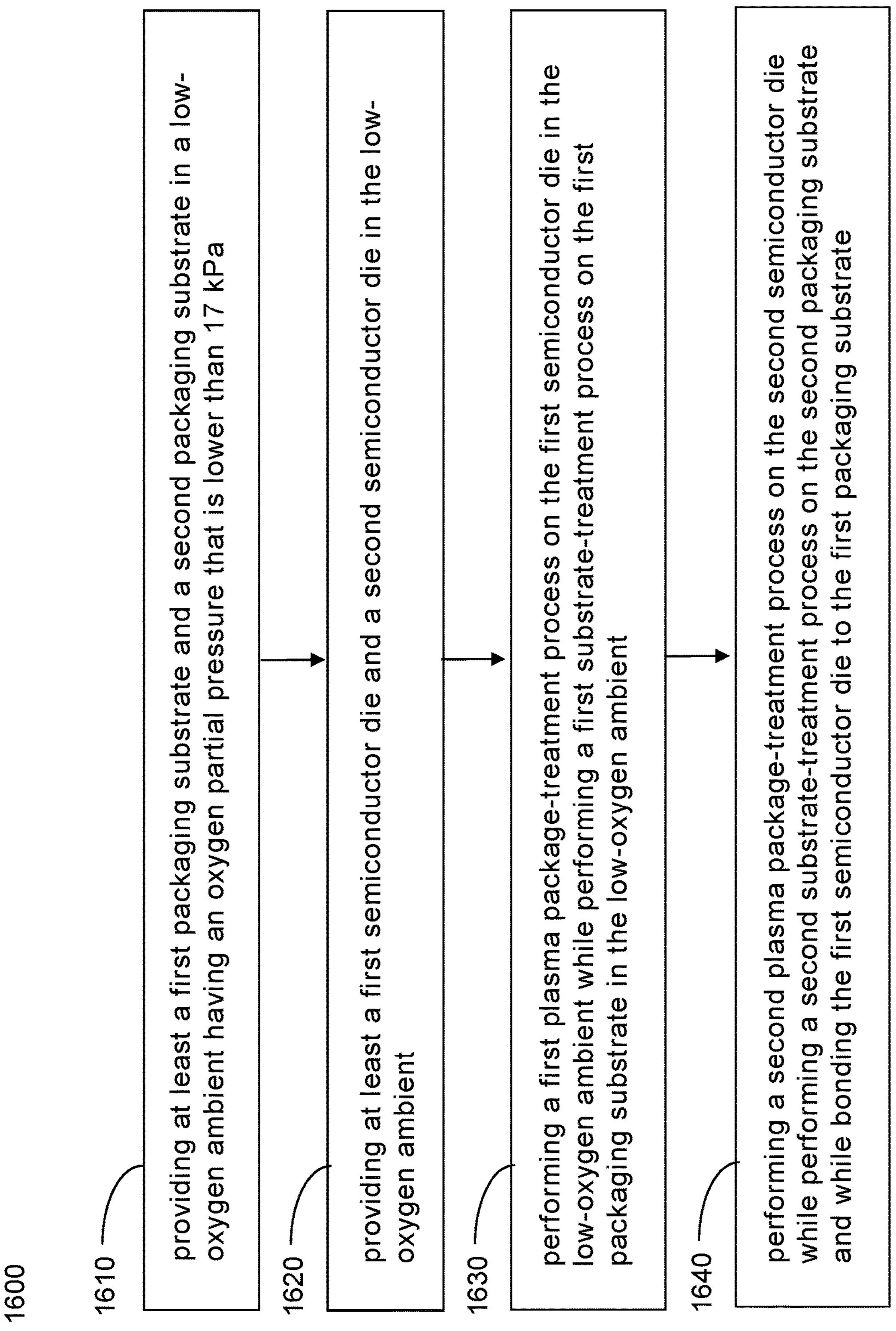
FIG. 16 is a first flowchart illustrating steps for forming a bonded assembly according to an embodiment of the present disclosure.

FIG. 16 is a first flowchart illustrating a method 1600 having steps for forming a bonded assembly according to an embodiment of the present disclosure.

Referring to step 1610 and FIGS. 1-3 and 14, at least a first packaging substrate 201 and a second packaging substrate 202 may be provided in a low-oxygen ambient 29 having an oxygen partial pressure that is lower than 17 kPa.

Referring to step 1620 and FIGS. 1-3, 14, and 15, at least a first semiconductor package 101 and a second semiconductor package 102 may be provided in the low-oxygen ambient 29.

Referring to step 1630 and FIGS. 4 and 14, a first plasma package-treatment process may be performed on the first semiconductor package 101 in the low-oxygen ambient 29 while performing a first substrate-treatment process on the first packaging substrate 201 in the low-oxygen ambient 29.

Referring to step 1640 and FIGS. 5-13 and 15, a second plasma package-treatment process may be performed on the second semiconductor package 102 while performing a second substrate-treatment process on the second packaging substrate 202 and while bonding the first semiconductor package 101 to the first packaging substrate 201.

In one embodiment, the method 1600 may further include the step of bonding the second semiconductor package 102 to the second packaging substrate 202 after bonding the first semiconductor package 101 to the first packaging substrate 201. In one embodiment, the method 1600 may further include the steps of: providing a third packaging substrate 203 in the low-oxygen ambient 29; providing a third semiconductor package 103 in the low-oxygen ambient 29; and performing a third plasma package-treatment process on the third semiconductor package 103 and performing a third substrate-treatment process on the third packaging substrate 203 while bonding the second semiconductor package 102 to the second packaging substrate 202. In one embodiment, the first packaging substrate 201 and the second packaging substrate 202 may be portions of a wafer that are laterally spaced apart among one another. In one embodiment, the first semiconductor package 101 may include first package-side bonding structures 18 to which first solder material portions 30 are attached; and the first plasma package-treatment process cleans the first solder material portions 30. In one embodiment, the first packaging substrate 201 may include first substrate-side bonding structures 28; and the first substrate-treatment process cleans the first substrate-side bonding structures 28. In one embodiment, the first semiconductor package 101 may be bonded to the first packaging substrate 201 by reflowing the first solder material portions 30 in the low-oxygen ambient 29. In one embodiment, the low-oxygen ambient 29 may be provided within a process chamber comprising a chamber enclosure 30 that comprises a chamber opening and a door 32 configured to fit the chamber opening; the first packaging substrate 201, the second packaging substrate 202, the first semiconductor package 101, and the second semiconductor package 102 may be loaded into the process chamber while the door 32 is open; and the first plasma package-treatment process and the first substrate-treatment process may be performed while the door 32 is closed. In one embodiment, the low-oxygen ambient 29 is provided in an apparatus 100 configured to sequentially transport the first semiconductor package 101 and the second semiconductor package 102 over a plasma nozzle 51; the first plasma package-treatment process may be performed while the first semiconductor package 101 is positioned over the plasma nozzle 51; and the second semiconductor package 102 is moved over the plasma nozzle 51 after performing the first plasma package-treatment process. In one embodiment, the first semiconductor package 101 may include a fan-out package including at least one semiconductor chip and an interposer.

Figure 17:
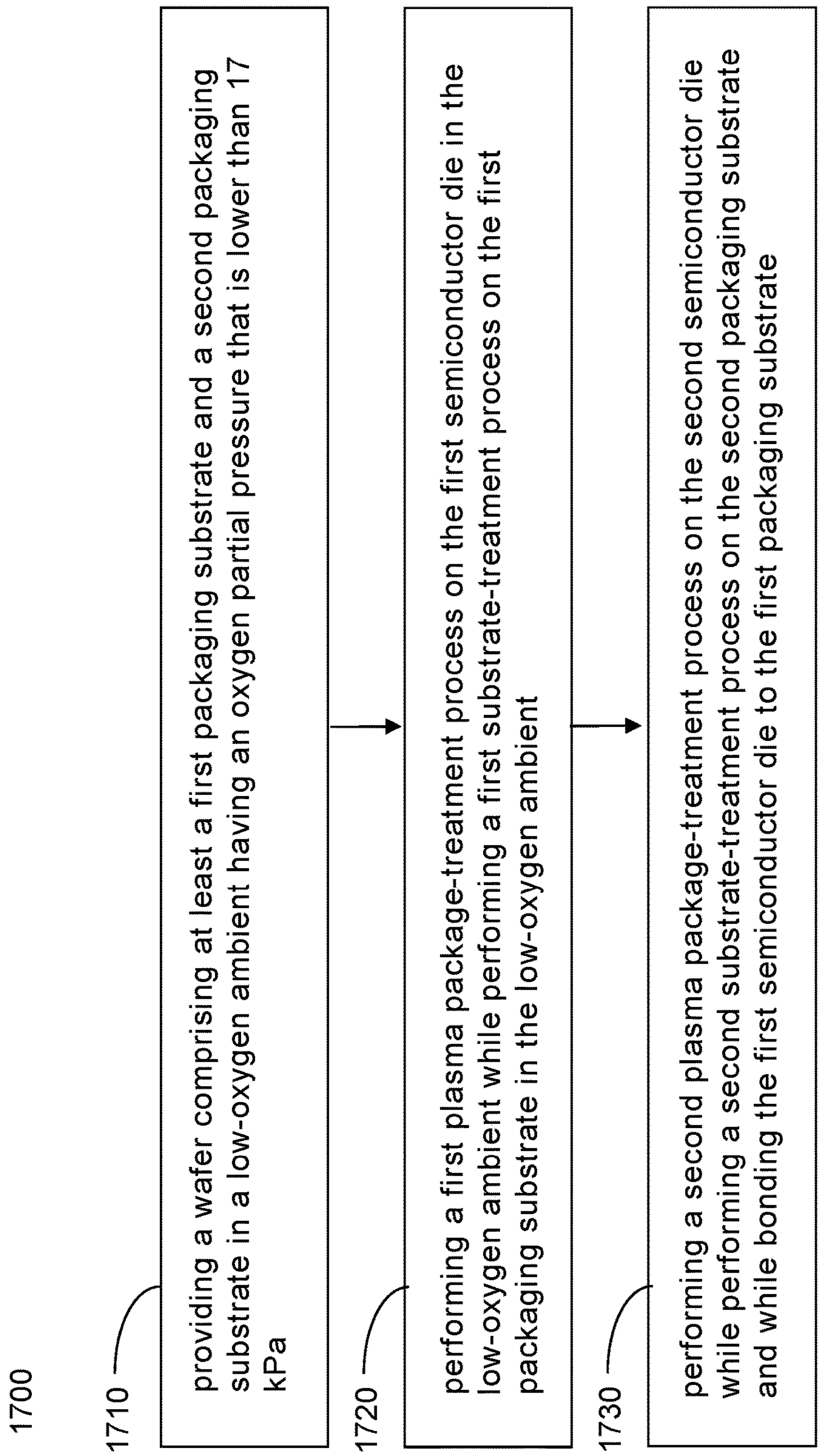
FIG. 17 is a second flowchart illustrating steps for forming a bonded assembly according to an embodiment of the present disclosure.

FIG. 17 is a second flowchart illustrating a method 1700 having steps for forming a bonded assembly according to an embodiment of the present disclosure.

Referring to step 1710 and FIGS. 1-3 and 14, a wafer 20W comprising at least a first packaging substrate 201 and a second packaging substrate 202 may be provided in a low-oxygen ambient 29 having an oxygen partial pressure that is lower than 17 kPa.

Referring to step 1720 and FIGS. 4 and 14, a first plasma package-treatment process may be performed on the first semiconductor package 101 in the low-oxygen ambient 29 while performing a first substrate-treatment process on the first packaging substrate 201 in a low-oxygen ambient 29.

Referring to step 1730 and FIGS. 5-13 and 15, a second plasma package-treatment process may be performed on the second semiconductor package 102 while performing a second substrate-treatment process on the second packaging substrate 202 and while bonding the first semiconductor package 101 to the first packaging substrate 201.

In one embodiment, the method 1700 may further include the step of bonding the second semiconductor package 102 to the second packaging substrate 202 after bonding the first semiconductor package 101 to the first packaging substrate 201. In one embodiment, the wafer may include a third packaging substrate 203 therein; and the method 1700 may also include the step of performing a third plasma package-treatment process on a third semiconductor package 103 and performing a third substrate-treatment process on the third packaging substrate 203 while bonding the second semiconductor package 102 to the second packaging substrate 202. In one embodiment, the first semiconductor package 101 comprises first package-side bonding structures 18 to which first solder material portions 30 may be attached; and the first plasma package-treatment process cleans the first solder material portions 30. In one embodiment, the first packaging substrate 201 may include first substrate-side bonding structures 28; and the first substrate-treatment process cleans the first substrate-side bonding structures 28, wherein the first semiconductor package 101 may be bonded to the first packaging substrate 201 by reflowing the first solder material portions 30 in the low-oxygen ambient 29.

Referring to all drawings and according to various embodiments of the present disclosure, an apparatus for forming a bonded assembly may be provided, the apparatus may include: a process chamber including chamber enclosure 30 and an ambient control system configured to provide a low-oxygen ambient 29 having an oxygen partial pressure that is lower than 17 kPa within a volume that is spatially bounded by the chamber enclosure; a first plasma treatment system 50 located within the process chamber and comprising a first plasma nozzle 51 and configured to generate a first plasma P1 in a first plasma zone PZ1; a second plasma treatment system 60 located within the process chamber and comprising a second plasma nozzle 61 configured to generate a second plasma P2 in a portable second plasma zone PZ2; a thermocompressive bonding head 40 configured to bond a semiconductor package 10 to a packaging substrate 20; a first transport system (70, 72) configured to laterally move semiconductor packages 10 to a selected package bonding position selected from a plurality of package bonding positions; and a second transport system 80 configured to move the second plasma treatment system 60 to a selected plasma treatment position selected from a plurality of plasma treatment positions and configured to move a thermocompressive bonding head 40 to a selected bonding position selected from a plurality of bonding positions.

In one embodiment, the apparatus may also include a third transport system 90 configured to transport a wafer including a plurality of packaging substrates 20 into a processing position, wherein the plurality of package bonding positions overlies a location of a respective packaging substrate selected from the plurality of packaging substrates 20. In one embodiment, the apparatus may also include a process controller 300 configured to control operation of the first plasma treatment system 50, the second plasma treatment system 60, and the thermocompressive bonding head 40, wherein the process controller 300 comprises a processor and a memory in communication with the processor and is loaded with a program that simultaneously performs a first plasma package-treatment process on a first semiconductor package 101 and a first substrate-treatment process on a first packaging substrate [20] 201 within the wafer. In one embodiment, the process controller may be configured to simultaneously perform a bonding operation on a combination of the first semiconductor package 101 and the first packaging substrate 201, a plasma package-treatment process on a second semiconductor package 102, and a substrate-treatment process on a second packaging substrate 202 within the wafer after simultaneously performing the first plasma package-treatment process and the first substrate-treatment process. In one embodiment, the first plasma treatment system is stationary, and the first transport system 70, 72 may be configured to transport a selected semiconductor package 10 to a position in proximity to the first plasma treatment system prior to performing a plasma package-treatment process and to transport the selected semiconductor package 10 to a position facing a selected packaging substrate 20 after performing the plasma package-treatment process.

The various embodiments of the present disclosure may be used to provide parallel processing of at least two pairs of semiconductor packages 10 and packaging substrates 20. A pair of a semiconductor package 10 and a packaging substrate 20 may be cleaned using plasma treatment processes in a same low-oxygen ambient 29 that is used to bond another pair of a semiconductor package 10 and a packaging substrate 20 at the same time. The throughput of the bonding apparatus may be increases while providing in-situ clean to the semiconductor packages 10 and the packaging substrates 20. The in-situ clean may provide clean surfaces for bonding, and prevent formation of residues at bonding interfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a bonded assembly, the method comprising:

providing a first packaging substrate and a second packaging substrate in a low-oxygen ambient having an oxygen partial pressure that is lower than 17 kPa in a process chamber comprising a single chamber enclosure that spatially bounds the low-oxygen ambient;

providing a first semiconductor package and a second semiconductor package in the low-oxygen ambient;

performing a first plasma package-treatment process on the first semiconductor package in the low-oxygen ambient in the process chamber while simultaneously performing a first substrate-treatment process on the first packaging substrate in the low-oxygen ambient in the process chamber; and performing a second plasma package-treatment process on the second semiconductor package in the process chamber while simultaneously performing a second substrate-treatment process on the second packaging substrate in the process chamber and while simultaneously bonding the first semiconductor package to the first packaging substrate in the low-oxygen ambient in the process chamber.

2. The method of claim 1, further comprising bonding the second semiconductor package to the second packaging substrate after bonding the first semiconductor package to the first packaging substrate.

3. The method of claim 2, further comprising:

providing a third packaging substrate in the low-oxygen ambient;

providing a third semiconductor package in the low-oxygen ambient; and performing a third plasma package-treatment process on the third semiconductor package and performing a third substrate-treatment process on the third packaging substrate while bonding the second semiconductor package to the second packaging substrate.

4. The method of claim 1, wherein the first packaging substrate and the second packaging substrate are portions of a wafer that are laterally spaced apart from one another.

5. The method of claim 1, wherein:

the first semiconductor package comprises first package-side bonding structures to which first solder material portions are attached; and the first plasma package-treatment process cleans the first solder material portions.

6. The method of claim 5, wherein:

the first packaging substrate comprise first substrate-side bonding structures; and the first substrate-treatment process cleans the first substrate-side bonding structures.

7. The method of claim 5, wherein the first semiconductor package is bonded to the first packaging substrate by reflowing the first solder material portions in the low-oxygen ambient.

8. The method of claim 1, wherein:

the process chamber comprises a chamber opening and a door configured to fit the chamber opening;

the first packaging substrate, the second packaging substrate, the first semiconductor package, and the second semiconductor package are loaded into the process chamber while the door is open; and the first plasma package-treatment process and the first substrate-treatment process are performed while the door is closed.

9. The method of claim 1, wherein:

the low-oxygen ambient is provided in an apparatus configured to sequentially transport the first semiconductor package and the second semiconductor package over a plasma nozzle;

the first plasma package-treatment process is performed while the first semiconductor package is positioned over the plasma nozzle; and the second semiconductor package is moved over the plasma nozzle after performing the first plasma package-treatment process.

10. The method of claim 1, wherein the first semiconductor package comprises a fan-out package including a semiconductor chip and an interposer.

11. A method of forming a bonded assembly, the method comprising:

providing a wafer comprising at least a first packaging substrate and a second packaging substrate in a low-oxygen ambient having an oxygen partial pressure that is lower than 17 kPa in a process chamber comprising a single chamber enclosure that spatially bounds the low-oxygen ambient;

performing a first plasma package-treatment process on a first semiconductor package in the low-oxygen ambient in the process chamber while simultaneously performing a first substrate-treatment process on the first packaging substrate in the low-oxygen ambient in the process chamber; and performing a second plasma package-treatment process on the second semiconductor package in the process chamber while simultaneously performing a second substrate-treatment process on the second packaging substrate in the process chamber and while simultaneously bonding the first semiconductor package to the first packaging substrate in the process chamber.

12. The method of claim 11, further comprising bonding the second semiconductor package to the second packaging substrate after bonding the first semiconductor package to the first packaging substrate.

13. The method of claim 12, wherein:

the wafer comprises a third packaging substrate therein; and the method comprises performing a third plasma package-treatment process on a third semiconductor package and performing a third substrate-treatment process on the third packaging substrate while bonding the second semiconductor package to the second packaging substrate.

14. The method of claim 11, wherein:

the first semiconductor package comprises first package-side bonding structures to which first solder material portions are attached; and the first plasma package-treatment process cleans the first solder material portions.

15. The method of claim 14, wherein:

the first packaging substrate comprise first substrate-side bonding structures; and the first substrate-treatment process cleans the first substrate-side bonding structures, wherein the first semiconductor package is bonded to the first packaging substrate by reflowing the first solder material portions in the low-oxygen ambient.

16. A method of forming a plurality of bonded assemblies, the method comprising:

providing a wafer comprising at least a first packaging substrate and a second packaging substrate in a low-oxygen ambient having an oxygen partial pressure that is lower than 17 kPa in a process chamber comprising a single chamber enclosure that spatially bounds the low-oxygen ambient;

performing a first bonding process of a first semiconductor package to the first packaging substrate in the process chamber; and simultaneously with the performance of the first bonding process in the process chamber, performing in the process chamber a second plasma treatment process on a second semiconductor package and a second substrate-treatment process on the second packaging substrate.

17. The method of claim 16, wherein the first bonding process is performed at a dedicated first bonding station, and the second plasma treatment process is performed at a dedicated second plasma treatment station, wherein the first bonding station and the second plasma treatment station are configured to operate independently.

18. The method of claim 16, further comprising:

initiating the second plasma treatment process on the second semiconductor package before the first bonding process of the first semiconductor package is completed; and initiating a second bonding process for the second semiconductor package after the second plasma treatment process is completed, wherein the second bonding process is initiated before the first bonding process is completed.

19. The method of claim 16, wherein the second substrate-treatment process on the second packaging substrate is initiated and completed prior to the second semiconductor package being transported to a position facing the second packaging substrate, thereby preparing the second packaging substrate for plasma treatment and subsequent bonding.

20. The method of claim 16, wherein:

the first bonding process is a thermocompression bonding process; and the first semiconductor package and the first packaging substrate are not in contact with any flux material during the thermocompression bonding process.

* * * * *